(12) United States Patent
Han et al.

(10) Patent No.: US 9,450,106 B2
(45) Date of Patent: Sep. 20, 2016

(54) THIN FILM TRANSISTOR OF DISPLAY APPARATUS

(71) Applicant: LG DISPLAY CO., LTD., Seoul (KR)

(72) Inventors: Sang Kug Han, Goyang-si (KR); Ki Sul Cho, Gumi-si (KR); Choon Ho Park, Paju-si (KR); Jin Ho Choi, Paju-si (KR); Kuk Hwan Kim, Seoul (KR); Soo Hong Kim, Goyang-si (KR); Eun Ji Ham, Incheon (KR); Byoung Cheol Song, Jeongeup-si (KR)

(73) Assignee: LG Display Co., Ltd., Seoul (KR)

( * ) Notice: Subject to any disclaimer, the term of this patent is extended or adjusted under 35 U.S.C. 154(b) by 15 days.

(21) Appl. No.: 14/750,217

(22) Filed: Jun. 25, 2015

(65) Prior Publication Data

US 2015/0380567 A1    Dec. 31, 2015

(30) Foreign Application Priority Data

Jun. 27, 2014  (KR) ......................... 10-2014-0080195
Jun. 12, 2015  (KR) ......................... 10-2015-0083189
Jun. 12, 2015  (KR) ......................... 10-2015-0083192

(51) Int. Cl.
  *H01L 29/04*     (2006.01)
  *G09G 3/36*      (2006.01)
  (Continued)

(52) U.S. Cl.
  CPC ..... *H01L 29/78696* (2013.01); *H01L 29/0692* (2013.01); *H01L 29/42384* (2013.01); *H01L 29/78609* (2013.01); *H01L 29/78645* (2013.01); *H01L 29/78648* (2013.01)

(58) Field of Classification Search
  CPC .............. H01L 21/823412; H01L 21/823437; H01L 27/3276
  USPC .................................. 257/365; 349/139, 141
  See application file for complete search history.

(56) References Cited

U.S. PATENT DOCUMENTS 3,649,888 A  *  3/1972  Pitzer ...................... H01L 21/00
                                                      257/637
6,028,580 A  *  2/2000  Kosegawa .............. H01L 27/12
                                                      257/72

(Continued)

FOREIGN PATENT DOCUMENTS

GB        2459666 A      11/2009
JP     2006-128160 A      5/2006

OTHER PUBLICATIONS

In-Hyuk Song et al: "A high-performance multichannel dual-gate poly-Si TFT fabricated by excimer laser irradiation on a floating a-Si thin film", IEEE Electron Device Letters, IEEE Service Center, New York, NY, US, vol. 24, No. 9, Sep. 1, 2000, pp. 580-582, XP011424757, ISSN: 0741-3106, DOI: 10.1109/LED.2003.816586
* the whole document *.

*Primary Examiner* — Julio J Maldonado
*Assistant Examiner* — Omar Mojaddedi
(74) *Attorney, Agent, or Firm* — Dentons US LLP

(57) ABSTRACT

Disclosed is a thin film transistor (TFT) of a display apparatus which reduces a leakage current caused by a hump and decreases screen defects. The TFT includes an active layer and a first gate electrode with a gate insulator therebetween, and a source electrode and a drain electrode respectively disposed at both ends of the active layer. The gate electrode branches as a plurality of lines and overlaps the active layer. The active layer includes one or more channel areas between the source electrode and the drain electrode, one or more dummy areas, and a plurality of link areas between the one or more channel areas to connect the one or more channel areas in one pattern. A length of each of the one or more dummy areas extends from an edge of a corresponding channel area.

20 Claims, 22 Drawing Sheets

(51) Int. Cl.
*H01L 29/786* (2006.01)
*H01L 29/06* (2006.01)
*H01L 29/423* (2006.01)

(56) References Cited

U.S. PATENT DOCUMENTS

| | | |
|---|---|---|
| 6,084,248 A | 7/2000 | Inoue |
| 6,252,248 B1 | 6/2001 | Sano et al. |
| 2005/0156845 A1* | 7/2005 | Lee ............... G09G 3/3648 345/92 |
| 2005/0242349 A1* | 11/2005 | Lee ............... H01L 29/42384 257/59 |
| 2010/0176453 A1* | 7/2010 | Dennard ......... H01L 21/76254 257/368 |
| 2012/0286260 A1* | 11/2012 | Noda ............. H01L 29/66742 257/43 |
| 2013/0240872 A1 | 9/2013 | Noda |

* cited by examiner

| ITEM | RELATED ART | THE INVENTION | Vds(V) |
|---|---|---|---|
| Vth[V] | 1.40 | 1.56 | 0.1 |
| Vfb[V] | 0.27 | 0.66 | 10 |
| Mobility [cm²/Vs] | 60.2 | 65.0 | 0.1 |
| S-Factor [V/dec] | 0.17 | 0.18 | 10 |
| Ion [uA] | 601 | 620 | 10 |
| Ioff [pA] | 3.19 | 3.93 | 10 |

| ITEM | RELATED ART | THE INVENTION | Vds(V) |
|---|---|---|---|
| Vth[V] | 1.09 | 1.14 | 0.1 |
| Vfb[V] | 0.40 | 0.52 | 10 |
| Mobility [cm$^2$/Vs] | 104.8 | 132.1 | 0.1 |
| S-Factor [V/dec] | 0.13 | 0.14 | 10 |
| Ion [uA] | 15.57 | 20.54 | 10 |
| Ioff [pA] | 0.27 | 0.30 | 10 |

| STR | RELATED ART | THE INVENTION | Vds(V) |
|---|---|---|---|
| Vth[V] | 1.52 | 1.42 | 0.1 |
| Vfb[V] | 0.10 | 0.88 | 10 |
| Mobility [cm²/Vs] | 105 | 108 | 0.1 |
| S-Factor [V/dec] | 0.17 | 0.15 | 10 |
| Ion [uA] | 1106 | 1105 | 10 |
| Ioff [pA] @Vgs=0V | 5.8 | 1.3 | 10 |

| STR | RELATED ART | THE INVENTION | Vds(V) |
|---|---|---|---|
| Vth[V] | 1.52 | 1.40 | 0.1 |
| Vfb[V] | 0.10 | 0.76 | 10 |
| Mobility [cm²/Vs] | 112 | 113 | 0.1 |
| S-Factor [V/dec] | 0.17 | 0.17 | 10 |
| Ion [uA] | 1106 | 1112 | 10 |
| Ioff [pA] @Vgs=-10V | 2.19 | 3.32 | 10 |

THIN FILM TRANSISTOR OF DISPLAY APPARATUS

CROSS-REFERENCE TO RELATED APPLICATIONS

This application claims the benefit of the Korean Patent Application Nos. 10-2014-0080195 filed on Jun. 27, 2014, and 10-2015-0083189 filed on Jun. 12, 2015, and 10-2015-0083192 filed on Jun. 12, 2015, each of which are hereby incorporated by reference for all purposes as if fully set forth herein.

BACKGROUND

1. Field of the Invention

The present invention relates to a thin film transistor (TFT). More particularly, the invention relates to a TFT of a display apparatus that reduces a leakage current caused by a hump and thus decreases a screen defect.

2. Discussion of the Related Art

An organic light emitting diode (OLED) includes an organic emission layer which is formed between two electrodes (for example, an anode electrode and a cathode electrode). An electron and a hole are injected from the two electrodes into the organic emission layer, and an exciton is generated by combining the electron with the hole. The OLED is a device using the principle that light is emitted when the generated exciton is shifted from an excited state to a ground state.

Organic light emitting display apparatuses each include a plurality of pixels which are arranged in a matrix type. In the organic light emitting display apparatus, each of the plurality of pixels includes an OLED, which emits light with a data current (Ioled) input thereto, and a pixel circuit (PC) that drives the OLED. Also, a plurality of lines for supplying a driving voltage and a signal to the OLED and the pixel circuit (PC) are provided.

The OLED and the pixel circuit are included in each of the plurality of pixels, and the OLED of each pixel emits light according to an input image signal to display an image.

Here, the pixel circuit (PC) includes a scan TFT, a sensing TFT, a driving TFT, and a storage capacitor Cst. The plurality of lines include a data line (DL), a gate line (GL), a driving power line (PL), a sensing signal line (SL), and a reference power line (RL).

FIG. 1 illustrates a gate driver that supplies a scan signal to a pixel of an organic light emitting display apparatus, and illustrates one scan circuit.

Referring to FIG. 1, the scan circuit of the gate driver generates the scan signal and supplies the scan signal to a scan TFT of a pixel circuit through a gate line.

Here, among a plurality of buffer TFTs, a pull-up TFT outputs a high voltage (a gate high voltage) to the gate line, and a pull-down TFT T1 outputs a low voltage (a gate low voltage) to the gate line. Also, a switching TFT T2 is a reset TFT that shifts a voltage, charged into a Q node, to a low voltage (for example, a ground or VGL).

When a threshold voltage (Vth) of the switching TFT T2 is lowered, an off current (Ioff) increases, and thus, a voltage of the Q node is dropped, whereby an output voltage Vgout is lowered. Also, when a threshold voltage (Vth) of the pull-down TFT T1 is lowered, an off current (Ioff) increases, and thus, the output voltage Vgout which should be output at a VGH level is lowered. Here, the output voltage Vgout denotes a high voltage that is output when the pull-up TFT is turned on.

That is, when the pull-up TFT is turned on, the output voltage Vgout should be output at the VGH level, but the output voltage Vout becomes lower than a normal voltage due to the off current (Ioff) of each of the pull-down TFT T1 and the switching TFT T2. When the output voltage Vgout of the scan circuit is lowered, a switching TFT of a pixel circuit is not normally turned on, causing a screen defect.

FIG. 2A is a diagram illustrating a plan layout of a pull-down TFT included in a scan circuit. FIG. 2B is a diagram illustrating a plan layout of a reset TFT included in the scan circuit. FIG. 2C is a diagram illustrating a plan layout of a driving TFT included in a pixel circuit. FIG. 3 illustrates a cross-sectional surface of the pull-down TFT taken along line A1-A2 of FIG. 2A, a cross-sectional surface of the reset TFT taken along line A1-A2 of FIG. 2B, and a problem where a hump occurs in the pull-down TFT and the reset TFT. The pull-down TFT and the reset TFT are formed in a coplanar top gate type. Cross-sectional surfaces of the pull-down TFT, the reset TFT, and the driving TFT are similar, and thus, the cross-sectional surface of the driving TFT is not illustrated.

As illustrated in FIG. 2A, the pull-down TFT T1 is formed to have a larger area than those of other TFTs, a gate electrode 2 is formed in a double line structure, and a multichannel is formed by overlapping of an active layer 1 and the gate electrode 2. A channel area of the active layer 1 contacts a source electrode 3 and a drain electrode 4.

As illustrated in FIG. 2B, the switching TFT T2 is formed to have a smaller area than that of the pull-down TFT T1, and a gate electrode 2 is formed in a double line structure for forming a multichannel. An active layer 1 is formed in one pattern and contacts a source electrode 3 and a drain electrode 4.

As illustrated in FIG. 2C, in the driving TFT of the pixel circuit, a gate electrode 2 is formed in a single line structure, and an active layer 1 is formed in one pattern and contacts a source electrode 3 and a drain electrode 4.

As illustrated in FIG. 3, a gate insulator 5 is formed between an active layer 1 and a gate electrode 2. Left and right edges of the active layer 1 have a taper form, and thus, a parasitic TFT is formed. That is, the taper forms of the left and right edges of the active layer 1 overlap the gate electrode 2, and thus, the parasitic TFT is formed.

In FIG. 3, although the cross-sectional surface of the driving TFT is not illustrated, identically or similarly to the pull-down TFT T1 and the switching TFT T2, left and right edges of an active layer of the driving TFT have a taper form, and thus, a parasitic TFT is formed.

A channel is formed in an area where the gate electrode 2 overlaps the active layer 1. Here, threshold voltages Vth1 and Vth3 are lower than a threshold voltage Vth2 of the channel due to the parasitic TFTs which are formed in the left and right edges of the active layer 1. When the threshold voltages Vth1 and Vth3 are lowered by the parasitic TFTs, strong electric fields are generated in the left and right edges of the active layer 1.

As shown in a transfer curve characteristic showing a shift of a drain current caused by a shift of a gate voltage, a current should linearly increase in a section of 0 V to 3 V, but since a strong electric field is generated in an edge area of an active layer, a hump where a current is nonlinearly shifted occurs. When the hump occurs, a delay of a turn-on/off time of a TFT extends, and for this reason, a switching characteristic is degraded.

As described above, a leakage current (or an off current) occurs due to humps caused by the parasitic TFTs of the left and right edges of the active layer 1, an output voltage Vgout of the scan circuit is lowered. Also, the switching TFT of the pixel circuit cannot normally operate (turn on/off), causing a screen defect.

SUMMARY

Accordingly, the present invention is directed to a TFT of a display apparatus that substantially obviates one or more problems due to limitations and disadvantages of the related art.

An aspect of the present invention is directed to provide a thin film transistor (TFT) that reduces leakage current caused by a hump.

Another aspect of the present invention is directed to a TFT of a display apparatus which prevents an output voltage of a scan circuit from being dropped due to a hump of a TFT included in a scan circuit of a gate driver, thereby preventing a screen defect of the display apparatus.

Another aspect of the present invention is directed to provide a TFT of a display apparatus which prevents a leakage current (or an off current) from occurring due to a hump of a driving TFT included in a pixel circuit, thereby preventing a screen defect of the display apparatus.

In addition to the aforesaid aspects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a thin film transistor (TFT) of a display apparatus including: an active layer and a first gate electrode disposed with a gate insulator therebetween; and a source electrode and a drain electrode respectively disposed at both ends of the active layer. The first gate electrode branches as a plurality of lines and is disposed to overlap the active layer. The active layer may be disposed on a substrate. The active layer includes: one or more channel areas disposed between the source electrode and the drain electrode; one or more dummy areas, a length of each of the one or more dummy areas extending from an edge of a corresponding channel area; and a plurality of link areas disposed between the one or more channel areas to connect the one or more channel areas in one pattern.

The TFT may further include: a second insulator disposed under the active layer; and a second gate electrode disposed under the second insulator. The second gate electrode may be disposed to overlap the active layer, and the first gate electrode may be electrically connected to the second gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
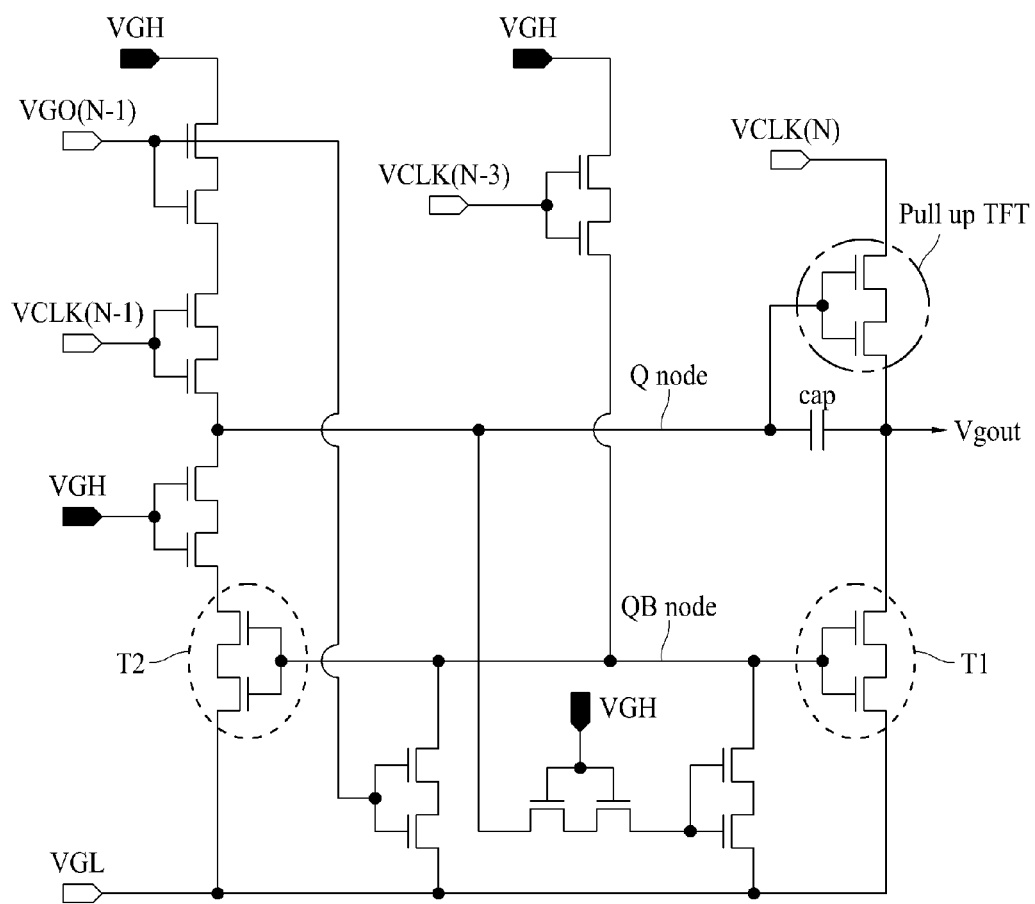
FIG. 1 illustrates a gate driver that supplies a scan signal to a pixel of an organic light emitting display apparatus, and illustrates one scan circuit.
Figure 2A:
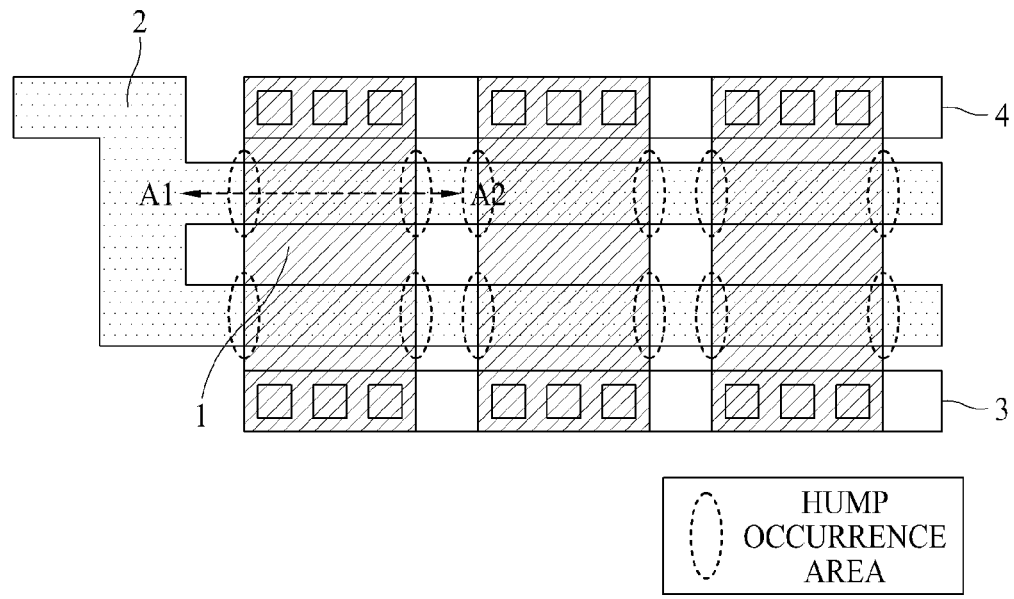
FIG. 2A is a diagram illustrating a plan layout of a pull-down TFT included in a scan circuit.
Figure 2B:
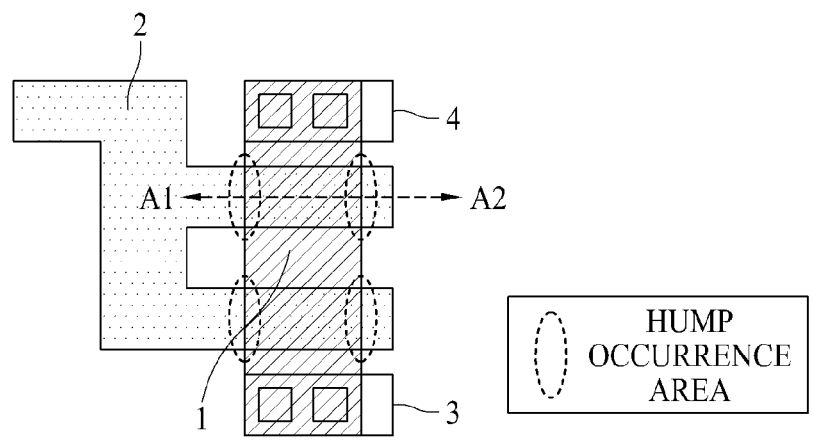
FIG. 2B is a diagram illustrating a plan layout of a reset TFT included in the scan circuit.
Figure 2C:
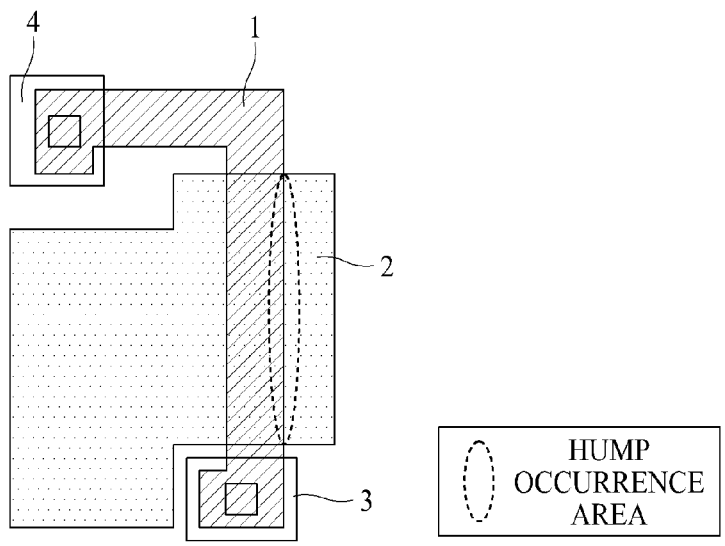
FIG. 2C is a diagram illustrating a plan layout of a driving TFT included in a pixel circuit.
Figure 3:
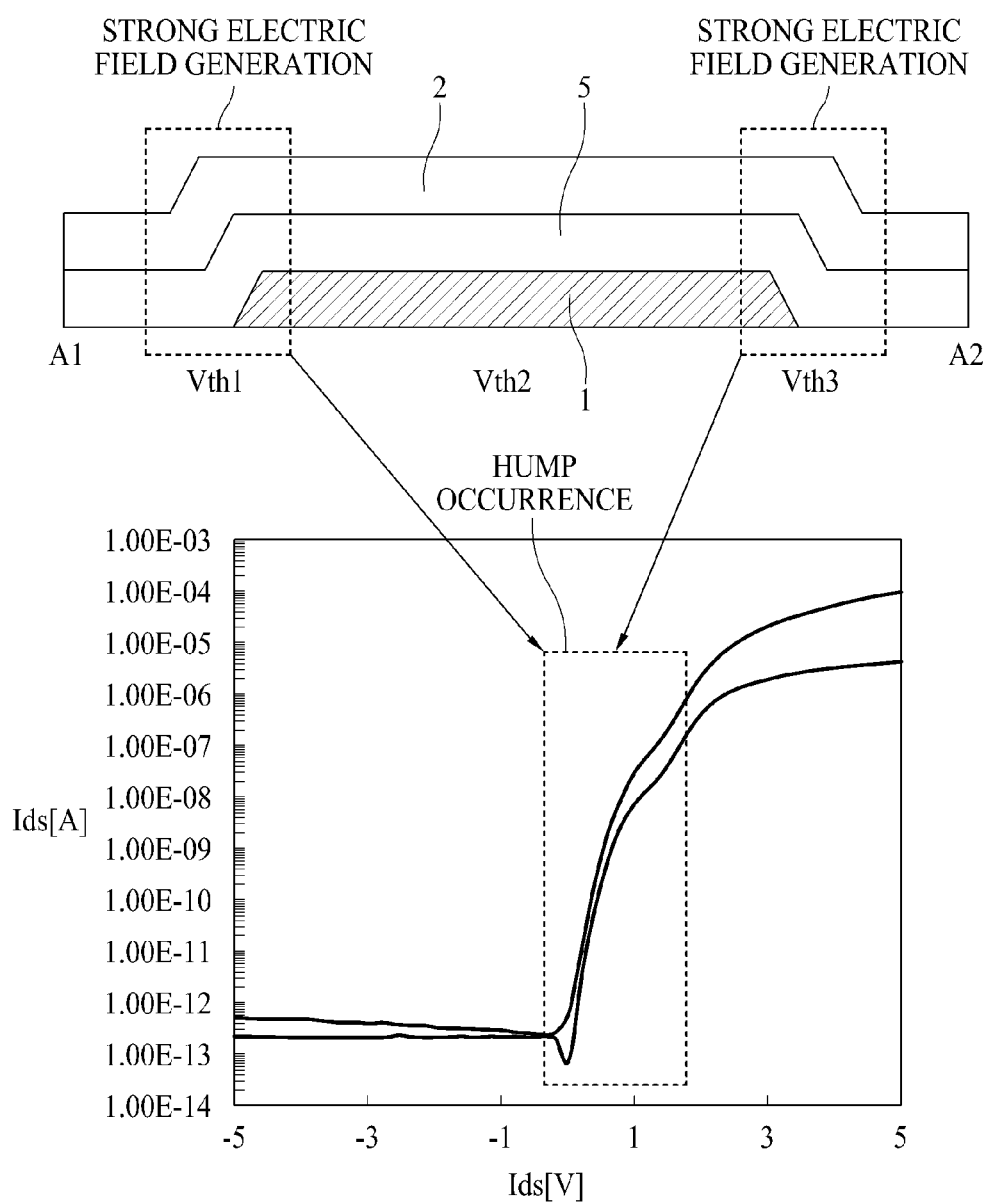
FIG. 3 illustrates a cross-sectional surface of the pull-down TFT taken along line A1-A2 of FIG. 2A, a cross-sectional surface of the reset TFT taken along line A1-A2 of FIG. 2B, and a problem where a hump occurs in the pull-down TFT and the reset TFT.

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a thin film transistor (TFT) of a display apparatus according to embodiments of the present invention will be described in detail with reference to the accompanying drawings.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Figure 4:
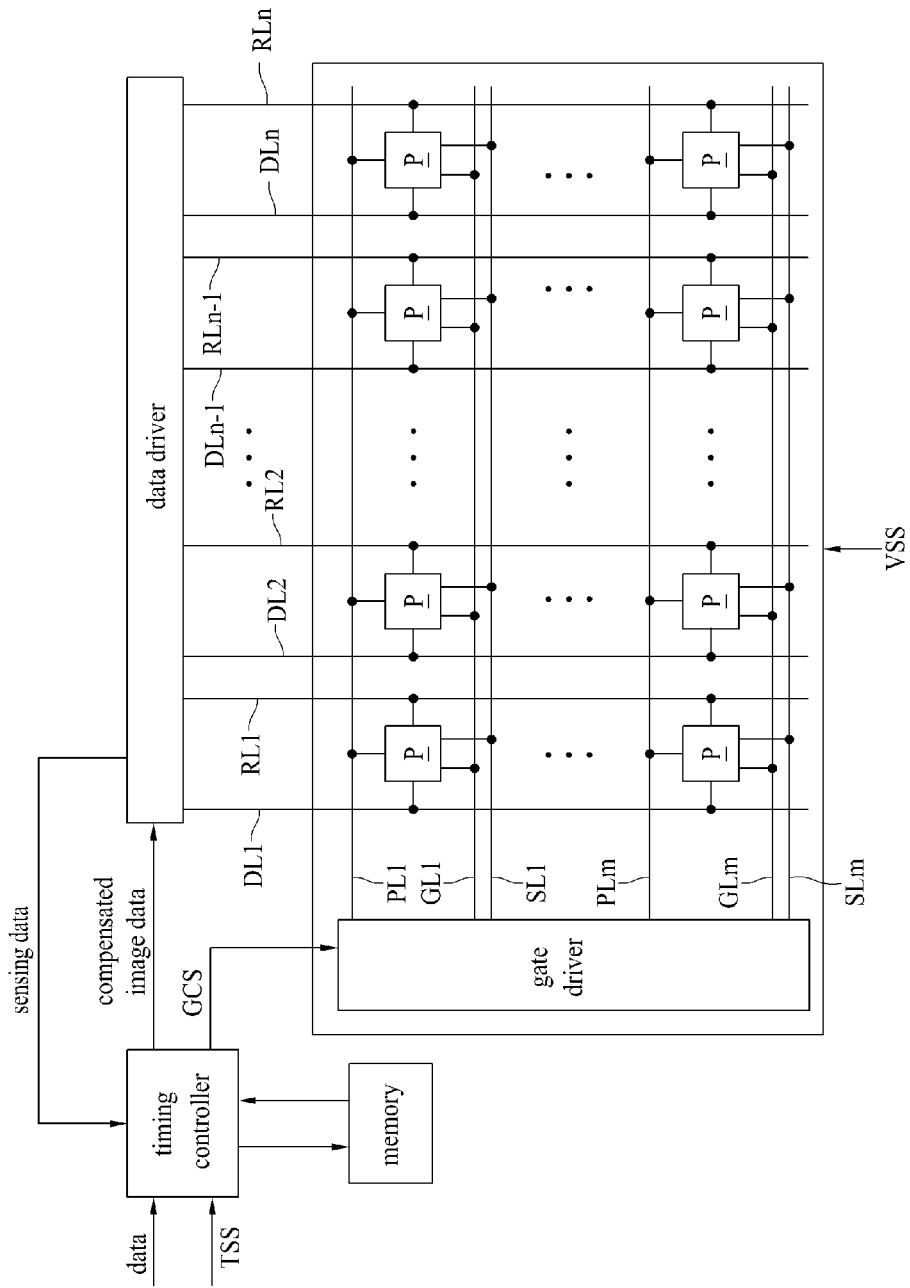
FIG. 4 is a diagram schematically illustrating an organic light emitting display apparatus including a TFT according to an embodiment of the present invention.
Figure 5:
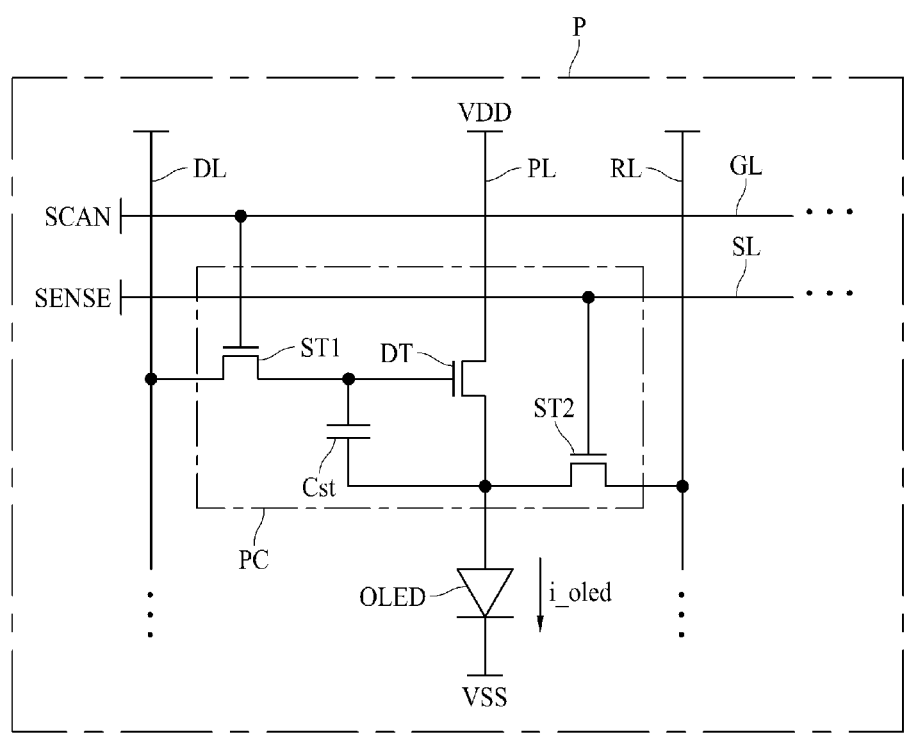
FIG. 5 is a diagram illustrating one of a plurality of pixels provided in an organic light emitting display apparatus.

FIG. 4 is a diagram schematically illustrating an organic light emitting display apparatus including a TFT according to an embodiment of the present invention, and FIG. 5 is a diagram illustrating one of a plurality of pixels provided in an organic light emitting display apparatus.

Referring to FIGS. 4 and 5, the organic light emitting display apparatus including the TFT according to an embodiment of the present invention includes a display panel and a driving circuit unit that drives the display panel.

The driving circuit unit may include a data driver, a gate driver, a timing controller, and a memory.

The timing controller may operate the data driver and the gate driver in a driving mode, based on a timing sync signal TSS. Also, the timing controller may operate the data driver and the gate driver in a sensing mode, based on a timing sync signal TSS and thus cause a threshold voltage/mobility of a driving TFT DT of each of a plurality of sub-pixels to be sensed.

The gate driver may generate a scan signal SCAN (a gate driving signal) and a sensing signal SENSE according to a gate control signal GCS supplied from the timing controller. The gate driver may output the scan signal to a gate line GL and output the generated sensing signal to a sensing signal line SL. For example, the gate driver may generate the scan signal SCAN (the gate driving signal) having a gate-on voltage level at every one horizontal period, based on the gate control signal GCS. The gate driver may sequentially supply the generated scan signal SCAN to a plurality of the gate lines GL.

The gate driver may be provided on a substrate of a display panel in a gate-in panel (GIP) type. The GIP type gate driver may be provided in a non-display area of the substrate. The gate driver may be provided in a left or right non-display area of the display panel in the GIP type. Also, the gate driver may be provided in each of the left non-display area and the right non-display area of the display panel in the GIP type.

The scan signal SCAN (the gate driving signal) may have the gate-on voltage level during a data charging period of each of a plurality of sub-pixels P. The scan signal SCAN may have a gate-off voltage level during an emission period of each sub-pixel P. The gate driver may include a shift register that sequentially outputs the scan signal SCAN.

The gate driver may be connected to a plurality of driving power lines PL1 to PLm and may supply a driving voltage VDD to the plurality of driving power lines PL1 to PLm. If the driving voltage VDD is output from the gate driver, the plurality of driving power lines PL1 to PLm may be arranged in a horizontal line in the display panel. In FIG. 4, an example where the plurality of driving power lines PL1 to PLm are arranged in the horizontal line in the display panel is illustrated.

The data driver may convert input image data into a data voltage Vdata and supply the data voltage Vdata to a data line DL. In this case, initial compensation data and real-time compensation data may be reflected, and thus, the data voltage Vdata based on image data in which compensation data stored in the memory is reflected may be generated.

Hereinabove, the gate driver has been described as outputting the driving voltage VDD, but the present embodiment is not limited thereto. For example, the data driver may output the driving voltage VDD. In this case, the data driver may be connected to the plurality of driving power lines PL1 to PLm and may supply the driving voltage VDD to the plurality of driving power lines PL1 to PLm. If the driving voltage VDD is output from the data driver, the plurality of driving power lines PL1 to PLm may be arranged in a vertical direction in the display panel.

The plurality of gate lines GL, a plurality of the sensing signal lines SL, a plurality of the data lines DL, the plurality of driving voltage lines PL, and a plurality of reference voltage lines RL may be disposed in the display panel. The plurality of sub-pixels P may be defined by the lines GL, SL, DL, PL and RL. Each of the plurality of sub-pixels P may include an organic light emitting diode OLED and a pixel circuit PC that emits the organic light emitting diode OLED.

Each of the plurality of sub-pixels P may be one of a red sub-pixel, a green sub-pixel, a blue sub-pixel, and a white sub-pixel. When one pixel displaying an image is implemented in four colors, the one pixel may be configured with a red sub-pixel, a green sub-pixel, a blue sub-pixel, and a white sub-pixel.

The plurality of gate lines GL and the plurality of sensing signal lines SL may be arranged in parallel in a first direction (for example, the horizontal direction) in the display panel. In this case, the scan signal (the gate driving signal) may be applied from the data driver to the gate lines GL. Also, the sensing signals SENSE may be applied from the gate driver to the sensing signal lines SL.

The plurality of driving voltage lines PL may be arranged in parallel with the gate lines GL. A high-level driving voltage VDD may be supplied to the sub-pixels P through the driving power lines PL.

The plurality of data lines DL may be arranged in a second direction (for example, the vertical direction) to intersect the plurality of gate lines GL and the plurality of sensing signal lines SL. In this case, the data voltage Vdata may be supplied from the data driver to the data line DL. The data voltage Vdata may have a voltage level in which a compensation voltage corresponding to a shift of a threshold voltage (Vth) of the driving TFT DT of a corresponding sub-pixel P is reflected.

The plurality of reference voltage lines RL may be arranged in parallel with the plurality of data lines DL. A reference voltage or a sensing precharging voltage may be selectively supplied from the data driver to the reference voltage lines RL.

As illustrated in FIG. 5, the pixel circuit PC of each sub-pixel P may include a first switching TFT ST1, a second switching TFT ST2, a driving TFT DT, and a storage capacitor Cst. Here, the TFTs ST1, ST2 and DT included in the pixel circuit PC and a plurality of TFTs included in a scan circuit of the gate driver may be each implemented in an N type or a P type where an active layer is formed of low-temperature poly silicon (LTPS). However, the present embodiment is not limited thereto. For example, an amorphous silicon (a-Si) TFT, a poly-Si TFT, an oxide TFT, an organic TFT, and/or the like may be applied as the TFTs of the pixel circuit and the TFTs of the scan circuit.

The first switching TFT ST1 may be turned on according to the scan signal having the gate-on voltage level supplied to the gate line GL. When the first switching TFT ST1 is turned on, the data voltage Vdata supplied to the data line DL may be supplied to a gate electrode of the driving TFT DT.

The second switching TFT ST2 may be turned on according to the sensing signal SENSE having the gate-on voltage level supplied to the sensing signal line SL. When the second switching TFT ST2 is turned on, a display reference voltage or the sensing precharging voltage supplied to the reference voltage line RL may be supplied to a node disposed between the driving TFT DT and the organic light emitting diode OLED.

The driving TFT DT may be turned on by a voltage charged into the capacitor Cst at every emission period and may control an amount of current flowing from a first driving voltage source VDD to the organic light emitting diode OLED.

The organic light emitting diode OLED may emit single-color light, having luminance corresponding to the data current Ioled, with a data current Ioled supplied from the driving TFT DT of the pixel circuit PC.

Figure 6:
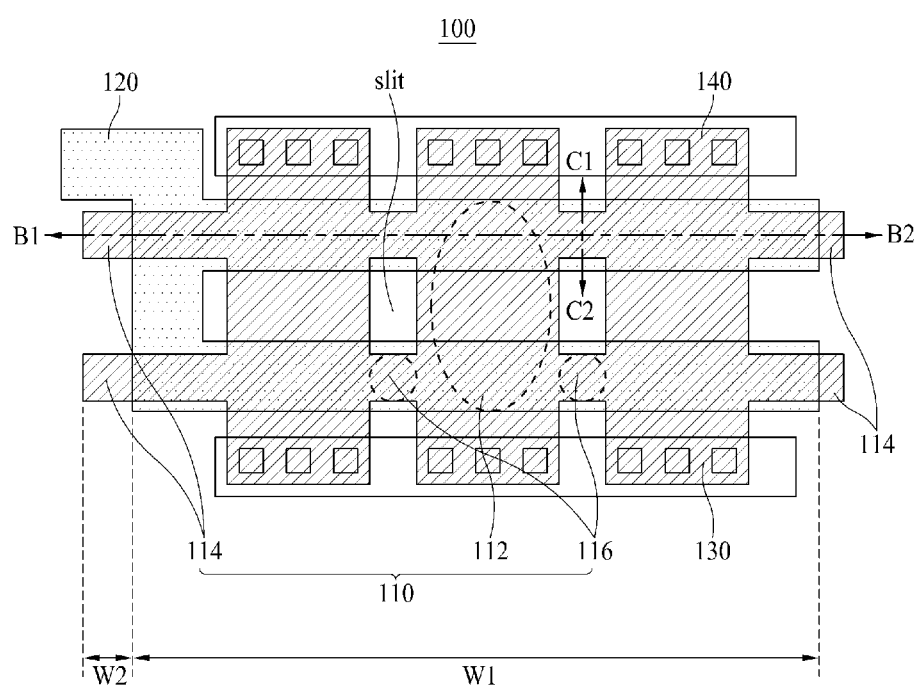
FIG. 6 illustrates a plan layout of a TFT according to a first embodiment of the present invention and is a diagram illustrating a plan layout of a pull-down TFT among a plurality of buffer TFTs included in a scan circuit of a gate driver.
Figure 8A:
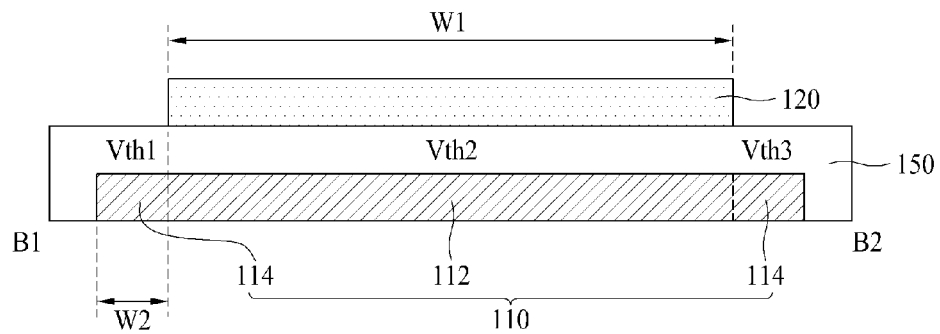
FIG. 8A is a diagram illustrating a cross-sectional surface of a pull-down TFT taken along lines B1-B2 and C1-C2 of FIG. 6.
Figure 8A:
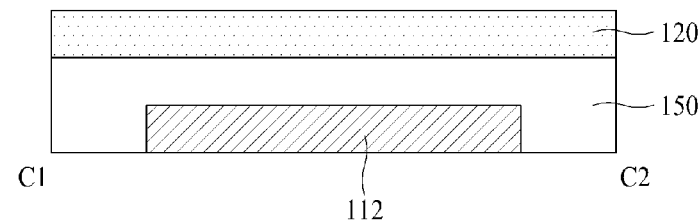

FIG. 6 illustrates a plan layout of a TFT 100 according to a first embodiment of the present invention and is a diagram illustrating a plan layout of a pull-down TFT among a plurality of buffer TFTs included in a scan circuit of a gate driver. FIG. 8A is a diagram illustrating a cross-sectional surface of a pull-down TFT taken along lines B1-B2 and C1-C2 of FIG. 6.

Referring to FIGS. 6 and 8A, the TFT 100 according to the first embodiment of the present invention may be applied to a plurality of buffer TFTs (a pull-up TFT and a pull-down TFT) of a scan circuit. Hereinafter, an example where the TFT 100 according to the first embodiment of the present invention is applied to a pull-down TFT (T1 of FIG. 1) among the buffer TFTs of the scan circuit will be described.

The pull-down TFT of the scan circuit may be implemented to have a larger area than those of general switching TFTs so as not to be deteriorated by a high voltage and long-time driving. In the TFT 100 according to the first embodiment of the present invention, the gate electrode 120 may be formed in a double line structure for forming a multichannel, and an active layer 110 may be patterned for forming a plurality of channels.

The TFT 100 according to the first embodiment of the present invention may be formed in a top gate structure. The active layer 110 may be formed on a substrate, and a gate insulator 150 may be formed on the active layer 110. The gate electrode 120 may be formed on the gate insulator 150.

The gate electrode 120 may branch as two lines from a gate line and may be long formed in a horizontal direction. With respect to a plane, a source electrode 130 may be disposed under the gate electrode 120, and a drain electrode 140 may be disposed on the gate electrode 120. However, the present embodiment is not limited thereto. As another example, with respect to the plane, the drain electrode 140 may be disposed under the gate electrode 120, and the source electrode 130 may be disposed on the gate electrode 120.

The active layer 110 may be formed to overlap the gate electrode 120, and a channel area of the active layer 110 may contact the source electrode 130 and the drain electrode 140. The gate electrode 120 may not wholly overlap the active layer 110, and the gate electrode 120 may partially overlap the active layer 110.

Here, the source electrode 130 and the drain electrode 140 may be respectively disposed at both ends of the active layer 110. The source electrode 130 may be connected to a data line through a contact metal which is provided in a contact hole, and the drain electrode 140 may be connected to an anode electrode (or a signal line) of an organic light emitting diode (OLED).

The active layer 110 may include a plurality of channel areas 112, a dummy area 114 which is disposed at each of a left edge and a right edge of each of the plurality of channel areas 112, and a plurality of link areas 116 which are disposed between the plurality of channel areas 112.

Here, the active layer 110 may be formed of low-temperature poly silicon (LTPS), but is not limited thereto. As another example, the active layer 110 may be formed of amorphous silicon (a-Si), poly-Si, oxide, an organic material, or the like.

The plurality of channel areas 112 may overlap the gate electrode 120 for forming a multichannel and may be disposed between the source electrode 130 and the drain electrode 140.

The plurality of link areas 116 may be respectively disposed between the plurality of channel areas 112 and may connect the plurality of channel areas 112. That is, the plurality of channel areas 112 may be connected in one pattern by the plurality of link areas 116.

Each of the plurality of link areas 116 may include a slit, and the slit may be disposed to overlap a portion corresponding to a space between two lines of the gate electrode 120.

In a process of forming the active layer 110, the plurality of channel areas 112 and the plurality of link areas 116 may be formed by patterning a conductive transparent material (for example, indium tin oxide (ITO) or the like) layer. Therefore, the plurality of channel areas 112 and the plurality of link areas 116 may be formed of the same material.

Here, a width of each of the plurality of link areas 116 may be formed less than a vertical-direction width of each of the two lines of the gate electrode 120.

The dummy area 114 may be disposed to extend from the left edge and right edge of the channel area 112 to an outer portion through an end of the gate electrode 120. That is, the dummy area 114 may protrude from the left edge and right edge of the channel area 112 and extend to a left outer portion and a right outer portion of the channel area 112. Therefore, the left edge and right edge of the active layer 110 may not overlap the gate electrode 120.

Here, an end of the dummy area 114 may be disposed at the outer portion of the gate electrode 120, and in detail, the end of the dummy area 114 may be disposed at a position which is separated from the edge of the gate electrode 120 by a certain distance. That is, the end of the dummy area 114 may be disposed to be separated from the edge of the gate electrode 120 by a certain interval.

For example, the dummy area 114 may protrude to the outer portion of the gate electrode 120 by a length W2 corresponding to 10% to 30% of a width W1 of the gate electrode 120. That is, an end of the dummy area 114 may be disposed to be separated from an edge of the gate electrode 120 by an interval equal to the length W2 corresponding to 10% to 30% of the width W1 of the gate electrode 120.

As another example, the dummy area 114 may protrude to the outer portion of the gate electrode 120 by a length W2 corresponding to 10% to 30% of a width W1 of a portion where the gate electrode 120 overlaps the active layer 110. That is, the end of the dummy area 114 may be disposed to be separated from the edge of the gate electrode 120 by an interval equal to the length W2 corresponding to 10% to 30% of the width W1 of the portion where the gate electrode 120 overlaps the active layer 110.

Here, a length by which the dummy area 114 protrudes may be set in consideration of an overlap margin of the gate electrode 120 and the active layer 110. Therefore, a numerical value of the length by which the dummy area 114 protrudes is not limited to the length W2 corresponding to 10% to 30% of the width W1 of the gate electrode 120 or the length W2 corresponding to 10% to 30% of the width W1 of the portion where the gate electrode 120 overlaps the active layer 110.

If the length by which the dummy area 114 protrudes is too shorter set (for example, less than 10% of the width W1 of the gate electrode 120 or less than 10% of the width W1 of the portion where the gate electrode 120 overlaps the active layer 110), the dummy area 114 may not protrude to the outer portion of the gate electrode 120. That is, the dummy area 114 may not normally be formed.

On the other hand, if the length by which the dummy area 114 protrudes is too longer set (for example, more than 30% of the width W1 of the gate electrode 120 or more than 30% of the width W1 of the portion where the gate electrode 120 overlaps the active layer 110), a size of the dummy area 114 increases, and for this reason, a whole size of a TFT increases. For this reason, all TFTs cannot be provided in a limited space, namely, a designing space is limited.

Therefore, it is set by the inventors that the dummy area 114 protrudes to the outer portion of the gate electrode 120 by the length W2 corresponding to a maximum of 30% of the width W1 of the gate electrode 120 in consideration of the design of the pull-down TFT configuring the scan circuit and a manufacturing process margin.

Moreover, it is set by the inventors that the dummy area 114 protrudes to the outer portion of the gate electrode 120 by the length W2 corresponding to a maximum of 30% of the width W1 of the portion where the gate electrode 120 overlaps the active layer 110, in consideration of the design of a TFT and a manufacturing process margin.

As illustrated in FIG. 8A, a gate insulator 150 may be formed on a left end and a right end of the active layer 110. However, the gate electrode 120 may not be disposed on the left end and right end (the end of the dummy area 114) of the active layer 110. Therefore, the edge of the active layer 110 does not overlap the gate electrode 120, and thus, a parasitic TFT caused by an overlap of a gate electrode and an edge of an active layer in the related art cannot be formed in the present invention. For example, even when the parasitic TFT is formed, the parasitic TFT is very small in size.

Therefore, a hump is prevented from occurring due to a parasitic TFT which is formed in the buffer TFTs of the scan circuit, and thus, an output characteristic of the buffer TFTs of the scan circuit is enhanced. If the output characteristic of the buffer TFTs of the scan circuit is enhanced, a screen defect of a display apparatus cannot occur, and thus, display quality is enhanced.

Figure 7:
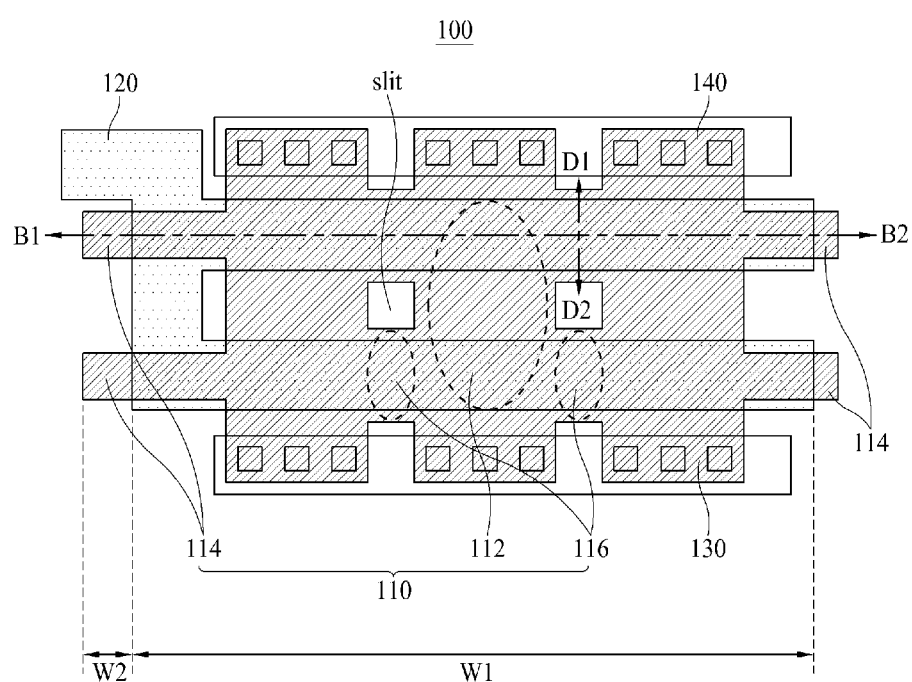
FIG. 7 illustrates a plan layout of a TFT according to a second embodiment of the present invention and is a diagram illustrating a plan layout of a pull-down TFT among a plurality of buffer TFTs included in a scan circuit of a gate driver.
Figure 8B:
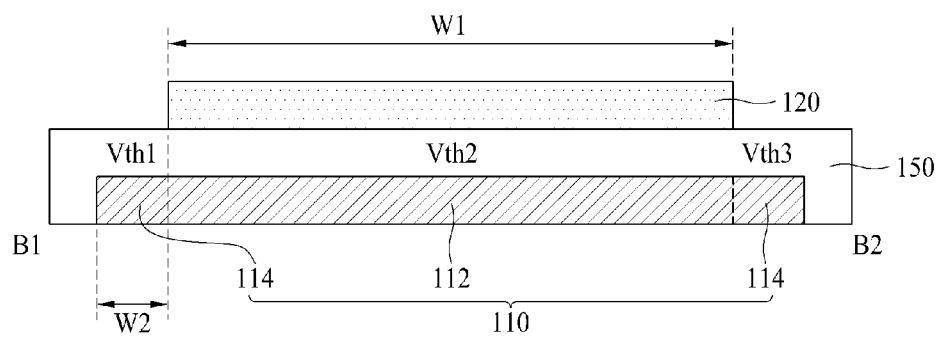
FIG. 8B is a diagram illustrating a cross-sectional surface of a pull-down TFT taken along lines B1-B2 and D1-D2 of FIG. 7.
Figure 8B:
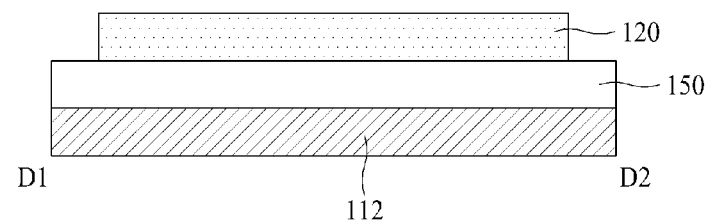

FIG. 7 illustrates a plan layout of a TFT 100 according to a second embodiment of the present invention and is a diagram illustrating a plan layout of a pull-down TFT among a plurality of buffer TFTs included in a scan circuit of a gate driver. FIG. 8B is a diagram illustrating a cross-sectional surface of a pull-down TFT taken along lines B1-B2 and D1-D2 of FIG. 7.

Referring to FIGS. 7 and 8B, in the TFT 100 according to the second embodiment of the present invention, a gate electrode 120 may be formed in a double line structure for forming a multichannel, and an active layer 110 may be patterned for forming a plurality of channels.

The gate electrode 120 may branch as two lines from a gate line and may be long formed in a horizontal direction. With respect to a plane, a source electrode 130 may be disposed under the gate electrode 120, and a drain electrode 140 may be disposed on the gate electrode 120. The active layer 110 may be disposed to overlap the gate electrode 120 and may contact the source electrode 130 and the drain electrode 140. However, the present embodiment is not limited thereto. As another example, with respect to the plane, the drain electrode 140 may be disposed under the gate electrode 120, and the source electrode 130 may be disposed on the gate electrode 120.

A plurality of channel areas 112 of the active layer 110 may overlap the gate electrode 120 for forming a multichannel and may be disposed between the source electrode 130 and the drain electrode 140. The gate electrode 120 may not wholly overlap the active layer 110, and the gate electrode 120 may partially overlap the active layer 110.

A plurality of link areas 116 of the active layer 110 may be respectively disposed between the plurality of channel areas 112 and may connect the plurality of channel areas 112. That is, the plurality of channel areas 112 may be connected in one pattern by the plurality of link areas 116. In this case, a width of each of the plurality of link areas 116 may be formed greater than a vertical-direction width of each of two lines of the gate electrode 120.

Each of the plurality of link areas 116 may include a slit, and the slit may be disposed to overlap a portion corresponding to a space between the two lines of the gate electrode 120.

A dummy area 114 of the active layer 110 may be disposed to extend from a left edge and a right edge of the channel area 112 to an outer portion through an end of the gate electrode 120. That is, the dummy area 114 may protrude from the left edge and right edge of the channel area 112, and ends of the dummy area 114 may be respectively disposed at a left outer portion and a right outer portion of the channel area 112. Therefore, the left edge and right edge (the dummy area 114) of the active layer 110 may not overlap the gate electrode 120.

Here, the ends of the dummy area 114 may be disposed at the outer portion of the gate electrode 120, and in detail, the ends of the dummy area 114 may be respectively disposed at positions which are separated from the edge of the gate electrode 120 by a certain distance.

For example, the dummy area 114 may protrude to the outer portion of the gate electrode 120 by a length W2 corresponding to 10% to 30% of a width W1 of the gate electrode 120. That is, the ends of the dummy area 114 may be disposed to be separated from an edge of the gate electrode 120 by an interval equal to the length W2 corresponding to 10% to 30% of the width W1 of the gate electrode 120.

As another example, the dummy area 114 may protrude to the outer portion of the gate electrode 120 by a length W2 corresponding to 10% to 30% of a width W1 of a portion where the gate electrode 120 overlaps the active layer 110. That is, the ends of the dummy area 114 may be disposed to be separated from the edge of the gate electrode 120 by an interval equal to the length W2 corresponding to 10% to 30% of the width W1 of the portion where the gate electrode 120 overlaps the active layer 110.

Here, a length of the dummy area 114 protruding from the channel area 112 is not limited to 10% to 30% of the width W1 of the gate electrode 120. It is set by the inventors that the dummy area 114 protrudes to the outer portion of the gate electrode 120 by a length corresponding to a maximum of 30% of the width W1 of the gate electrode 120 in consideration of the design of the pull-down TFT configuring the scan circuit and a manufacturing process margin.

Moreover, a length of the dummy area 114 protruding from the channel area 112 is not limited to 10% to 30% of the width W1 of the portion where the gate electrode 120 overlaps the active layer 110. It is set by the inventors that the dummy area 114 protrudes to the outer portion of the gate electrode 120 by a length W2 corresponding to a maximum of 30% of the width W1 of the gate electrode 120 in consideration of the design of the pull-down TFT configuring the scan circuit and a manufacturing process margin.

As illustrated in FIG. 8B, a gate insulator 150 may be formed on a left end and a right end of the active layer 110. However, the gate electrode 120 may not be disposed on the left end and right end (an end of the dummy area 114) of the active layer 110. Therefore, an edge of the active layer 110 does not overlap the gate electrode 120, and thus, a parasitic TFT caused by an overlap of a gate electrode and an edge of an active layer in the related art cannot be formed. For example, even when the parasitic TFT is formed, the parasitic TFT is very small in size.

Therefore, a hump is prevented from occurring due to a parasitic TFT which is formed in the buffer TFTs of the scan circuit, and thus, an output characteristic of the buffer TFTs of the scan circuit is enhanced. If the output characteristic of the buffer TFTs of the scan circuit is enhanced, a screen defect of a display apparatus cannot occur, and thus, display quality is enhanced.

In the TFT 100 including the above-described elements according to the first and second embodiments of the present invention, a parasitic TFT cannot be formed at the left end and right end of the active layer 110, or the number of parasitic TFTs is minimized. Here, a pattern of the active layer 110 may be changed in order for the edge of the active layer 110 to extend to the outer portion of the gate electrode 120, namely, the dummy area 114 may be provided, and thus, an area where a parasitic TFT is formed is removed or minimized.

The edge of the gate electrode 120 may be disposed in a diagonal direction from the left edge and right edge (the dummy area 114) of the active layer 110. However, the left edge and right edge (the dummy area 114) of the active layer 110 and the gate electrode 120 may be disposed to be separated from each other by a long distance with the gate insulator 150 therebetween. Therefore, even when a parasitic TFT is formed, the parasitic TFT is very small in size, and thus, a hump is prevented from occurring due to the parasitic TFT, or the number of humps is reduced.

Since the left edge and right edge of the active layer 110 do not overlap the gate electrode 120, threshold voltages Vth1 and Vth3 of parasitic TFTs may have larger values than that of a threshold voltage Vth2 of the channel area 112 of the active layer 110.

As described above, parasitic TFTs having a small size may be respectively formed at the left edge and right edge of the active layer 110, and threshold voltages Vth1 and Vth3 of the parasitic TFTs may have large values. Therefore, a hump is prevented from occurring in the left edge and right edge of the active layer 110, and a strong electric field is not generated in an edge area of the active layer 110.

If the TFT 100 according to the first and second embodiments of the present invention is applied to the buffer TFTs (in detail, the pull-down TFT) of the scan circuit of the gate driver, a leakage current (or an off current) is prevented from occurring in the scan circuit or is reduced. Accordingly, a signal is normally output through the Q node and QB node of the scan circuit, and thus, a screen defect of a display apparatus is prevented.

Figure 9:
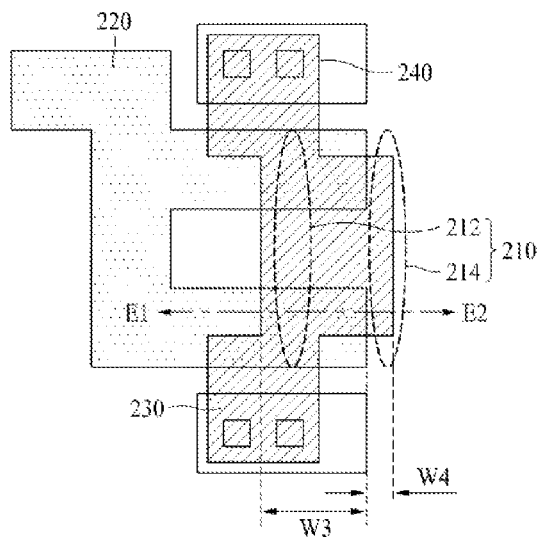
FIG. 9 illustrates a plan layout of a TFT according to a third embodiment of the present invention and is a diagram illustrating a plan layout of a switching TFT, included in a scan circuit of a gate driver, or a switching TFT included in a pixel circuit.
Figure 11A:
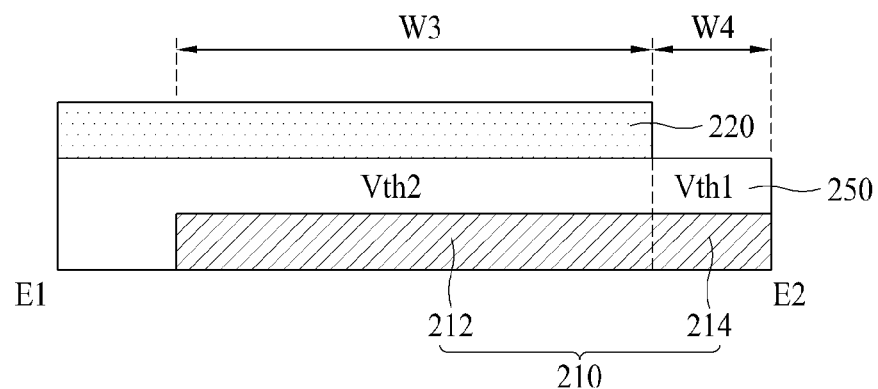
FIG. 11A is a diagram illustrating a cross-sectional surface, taken along line E1-E2 of FIG. 9, of a switching TFT included in a scan circuit or a switching TFT included in a pixel circuit.

FIG. 9 illustrates a plan layout of a TFT 200 according to a third embodiment of the present invention and is a diagram illustrating a plan layout of a switching TFT, included in a scan circuit of a gate driver, or a switching TFT included in a pixel circuit. FIG. 11A is a diagram illustrating a cross-sectional surface, taken along line E1-E2 of FIG. 9, of a switching TFT included in a scan circuit or a switching TFT included in a pixel circuit.

Referring to FIGS. 9 and 11A, the TFT 200 according to the third embodiment of the present invention may be applied to a switching TFT (T2 (a reset TFT) of FIG. 1) of a scan circuit. The switching TFT of the scan circuit should quickly operate in response to an input signal and thus may be formed to have a smaller area than that of a buffer TFT. Also, the TFT 200 according to a third embodiment of the present invention may be applied to a switching TFT of a pixel circuit. The switching TFT of the pixel circuit should quickly operate in response to an input signal and thus may be formed to have a smaller area than that of a driving TFT.

In the TFT 200 according to the third embodiment of the present invention, a gate electrode 220 may be formed in a double line structure for forming a multichannel, and an active layer 210 may be patterned for forming a plurality of channels.

The gate electrode 220 may branch as two lines from a gate line and may be long formed in a horizontal direction. With respect to a plane, a source electrode 230 may be disposed under the gate electrode 220, and a drain electrode 240 may be disposed on the gate electrode 220. However, the present embodiment is not limited thereto. As another example, with respect to the plane, the drain electrode 240 may be disposed under the gate electrode 220, and the source electrode 230 may be disposed on the gate electrode 220.

The active layer 210 may be disposed to overlap the gate electrode 220 and may contact the source electrode 230 and the drain electrode 240. A channel area may be disposed between the source electrode 230 and the drain electrode 240. The gate electrode 220 may not wholly overlap the active layer 210, and the gate electrode 220 may partially overlap the active layer 210.

As illustrated in FIG. 11A, the TFT 200 according to the third embodiment of the present invention may be formed in a top gate structure. Therefore, the active layer 210 may be formed on a substrate, and a gate insulator 250 may be formed on the active layer 210. The gate electrode 220 may be formed on the gate insulator 250.

The active layer 210 may include a channel area 212 and a dummy area 214 which is disposed at a right edge of the channel area 212. In FIGS. 9 and 11A, the dummy area 214 is illustrated as being disposed at the right edge of the channel area 212, but this is merely an example. In another embodiment of the present invention, the dummy area 214 may be disposed at a left edge of the channel area 212.

Here, the active layer 210 may be formed of low-temperature poly silicon (LTPS), but is not limited thereto. As another example, the active layer 210 may be formed of amorphous silicon (a-Si), poly-Si, oxide, an organic material, or the like.

The channel area 212 may overlap the gate electrode 220 for forming a multichannel and may be disposed between the source electrode 230 and the drain electrode 240. The gate electrode 220 may be disposed in a double line structure, and the active layer 210 may be disposed to overlap two lines of the gate electrode 220, whereby the multichannel is formed in the channel area 212.

The dummy area 214 may be disposed to extend from a right edge of the channel area 212 to an outer portion of an end of the gate electrode 220. That is, the dummy area 214 may protrude from one side edge (a right edge) of the channel area 212, and an end of the dummy area 214 may be disposed at one side outer portion (a right outer portion) of the channel area 212. Therefore, the right edge of the active layer 210 may not overlap the gate electrode 220.

Here, the end of the dummy area 214 may be disposed at the outer portion of the gate electrode 220. Therefore, the end of the dummy area 214 may be disposed to be separated from the edge of the gate electrode 220 by a certain distance.

For example, the dummy area 214 may protrude to the outer portion of the gate electrode 220 by a length W4 corresponding to 10% to 30% of a width W3 of a portion where the gate electrode 220 overlaps active layer 210. That is, the end of the dummy area 214 may be disposed to be separated from an edge of the gate electrode 220 by an interval equal to the length W4 corresponding to 10% to 30% of the width W3 of the portion where the gate electrode 220 overlaps active layer 210.

Here, a length of the dummy area 214 protruding from the channel area 212 is not limited to 10% to 30% of the width W3 of the portion where the gate electrode 220 overlaps the active layer 210. It is set by the inventors that the dummy area 214 protrudes to the outer portion of the gate electrode 220 by a length W4 corresponding to a maximum of 30% of the width W3 of the portion where the gate electrode 220 overlaps the active layer 210, in consideration of the design of a switching TFT configuring a scan circuit and a manufacturing process margin.

The gate insulator 250 may be formed on a right end of the active layer 210. However, the gate electrode 220 may not be disposed on the right end of the active layer 210. Therefore, a parasitic TFT caused by an overlap of a gate electrode and an edge of an active layer in the related art cannot be formed in the present invention. For example, even when the parasitic TFT is formed, the parasitic TFT is very small in size.

Figure 10:
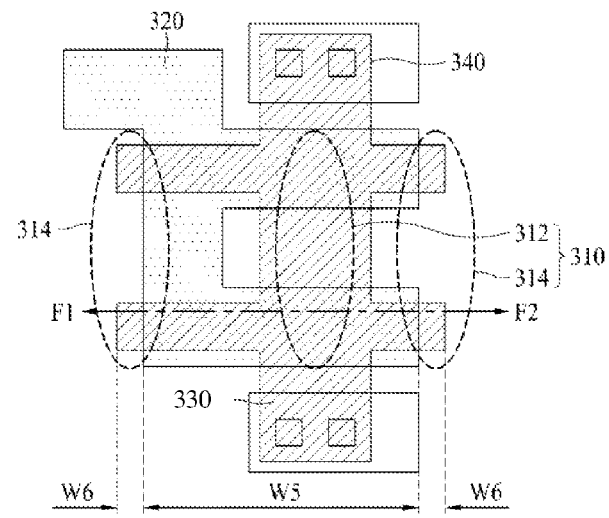
FIG. 10 illustrates a plan layout of a TFT according to a fourth embodiment of the present invention and is a diagram illustrating a plan layout of a switching TFT, included in a scan circuit of a gate driver, or a switching TFT included in a pixel circuit.
Figure 11B:
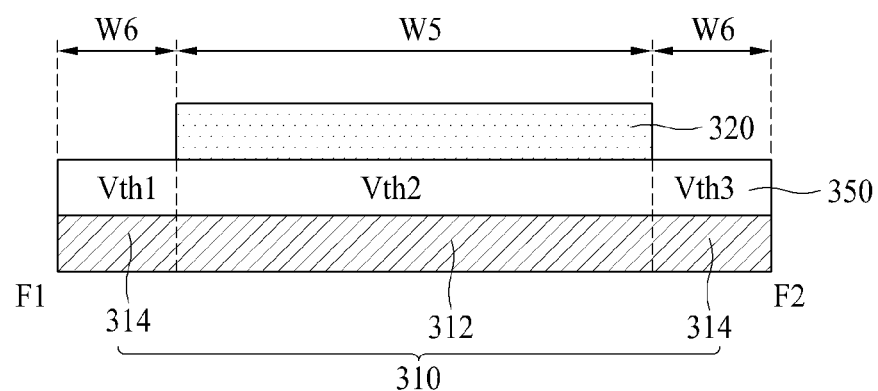
FIG. 11B is a diagram illustrating a cross-sectional surface, taken along line F11-F12 of FIG. 10, of a switching TFT included in a scan circuit or a switching TFT included in a pixel circuit.

FIG. 10 illustrates a plan layout of a TFT 300 according to a fourth embodiment of the present invention and is a diagram illustrating a plan layout of a switching TFT, included in a scan circuit of a gate driver, or a switching TFT included in a pixel circuit. FIG. 11B is a diagram illustrating a cross-sectional surface, taken along line F11-F12 of FIG. 10, of a switching TFT included in a scan circuit or a switching TFT included in a pixel circuit.

Referring to FIGS. 10 and 11B, in the TFT 300 according to the fourth embodiment of the present invention, a gate electrode 320 may be formed in a double line structure for forming a multichannel, and an active layer 310 may be patterned for forming a plurality of channels.

The gate electrode 320 may branch as two lines from a gate line and may be long formed in a horizontal direction. With respect to a plane, a source electrode 330 may be disposed under the gate electrode 320, and a drain electrode 340 may be disposed on the gate electrode 320. However, the present embodiment is not limited thereto. As another example, with respect to the plane, the drain electrode 340 may be disposed under the gate electrode 320, and the source electrode 330 may be disposed on the gate electrode 320.

The active layer 310 may be disposed to overlap the gate electrode 320, and a channel area of the active layer 310 may contact the source electrode 330 and the drain electrode 340. The active layer 310 may overlap two lines of the gate electrode 320 for forming a multichannel, and the channel area may be disposed between the source electrode 330 and the drain electrode 340. The gate electrode 320 may not wholly overlap the active layer 310, and the gate electrode 320 may partially overlap the active layer 310.

The dummy area 314 of the active layer 310 may be disposed to extend from a left edge and a right edge of the channel area 312 to an outer portion of an end of the gate electrode 320. That is, the dummy area 314 may protrude from the left edge and right edge of the channel area 312, and an end of the dummy area 314 may be disposed at a left outer portion and a right outer portion of the channel area 312. Therefore, the left edge and right edge of the active layer 310 may not overlap the gate electrode 320.

Here, the end of the dummy area 314 may be disposed at the outer portion of the gate electrode 320. Therefore, the end of the dummy area 314 may be disposed at a position which is separated from the left edge and right edge of the gate electrode 320 by a certain distance.

For example, the dummy area 314 may protrude to the outer portion of the gate electrode 320 by a length W6 corresponding to 10% to 30% of a width W5 of a portion where the gate electrode 320 overlaps active layer 310. That is, the end of the dummy area 314 may be disposed to be separated from an edge of the gate electrode 320 by an interval equal to the length W6 corresponding to 10% to 30% of the width W5 of the portion where the gate electrode 320 overlaps active layer 310.

Here, a length of the dummy area 314 protruding from the channel area 312 is not limited to 10% to 30% of the width W5 of the portion where the gate electrode 320 overlaps the active layer 310. It is set by the inventors that the dummy area 314 protrudes to the outer portion of the gate electrode 320 by a length W6 corresponding to a maximum of 30% of the width W5 of the portion where the gate electrode 320 overlaps the active layer 310, in consideration of the design of a switching TFT configuring a scan circuit or the design of a switching TFT configuring a pixel circuit and a manufacturing process margin.

In the TFT including the above-described elements according to the third and fourth embodiments of the present invention, a parasitic TFT cannot be formed at the left end and right end of the active layer 310, or the number of parasitic TFTs is minimized. Here, a pattern of the active layer 310 may be changed in order for the edge of the active layer 310 to extend to the outer portion of the gate electrode 320, and thus, an area where a parasitic TFT is formed is removed or minimized.

The edge of the gate electrode 320 may be disposed in a diagonal direction from the left edge and right edge (the dummy area 314) of the active layer 310. However, the left edge and right edge (the dummy area 314) of the active layer 310 and the gate electrode 320 may be disposed to be separated from each other by a long distance with the gate insulator 350 therebetween. Therefore, even when a parasitic TFT is formed, the parasitic TFT is very small in size, and thus, a hump is prevented from occurring due to the parasitic TFT, or the number of humps is reduced.

Since the left edge and right edge of the active layer 310 do not overlap the gate electrode 320, threshold voltages Vth1 and Vth3 of parasitic TFTs may have larger values than that of a threshold voltage Vth2 of the channel area 312 of the active layer 310.

As described above, parasitic TFTs having a small size may be respectively formed at the left edge and right edge of the active layer 310, and threshold voltages Vth1 and Vth3 of the parasitic TFTs may have large values. Therefore, a hump is prevented from occurring in the left edge and right edge of the active layer 310, and a strong electric field is not generated in an edge area of the active layer 310.

If the TFT according to the third and fourth embodiments of the present invention is applied to a switching TFT of a scan circuit of a gate driver, a leakage current (or an off current) of the switching TFT is reduced. Accordingly, a signal is normally output through a Q node and a QB node of the scan circuit, and thus, a screen defect of a display apparatus is prevented.

Moreover, if the TFT according to the third and fourth embodiments of the present invention is applied to the switching TFT of the pixel circuit illustrated in FIG. 5, a leakage current (or an off current) of the switching TFT of the pixel circuit is reduced, and thus, the pixel circuit is prevented from being abnormally driven. Accordingly, a data voltage is supplied to the driving TFT DT during a turn-off period of the organic light emitting diode OLED, thereby preventing a screen defect.

Figure 12:
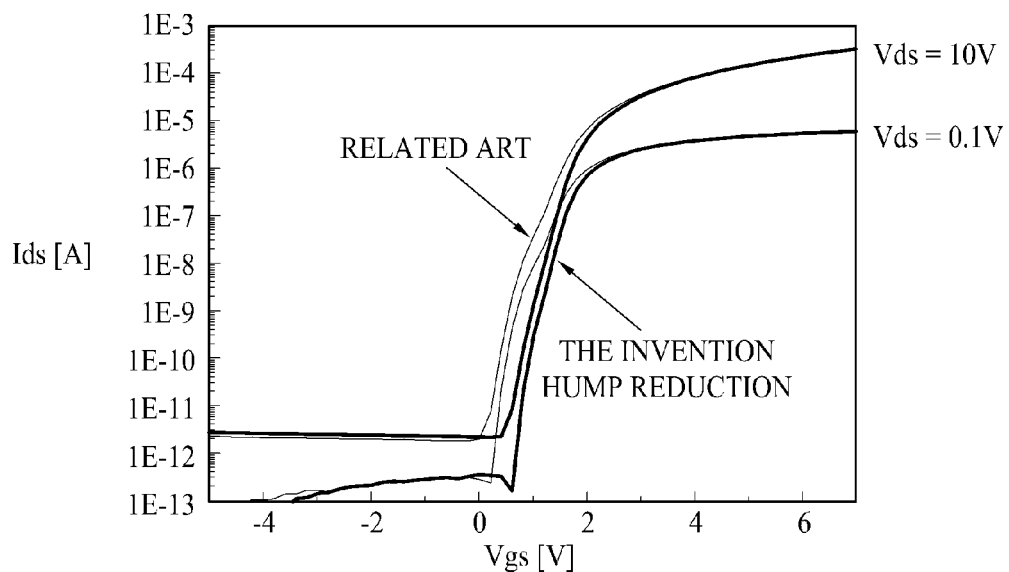
FIG. 12 is a diagram showing effects where, by changing a pattern of an active layer of a TFT according to first to fourth embodiments of the present invention, an output characteristic of the TFT is enhanced, and humps are reduced.

FIG. 12 is a diagram showing effects where, by changing a pattern of an active layer of a TFT according to first to fourth embodiments of the present invention, an output characteristic of the TFT is enhanced, and humps are reduced. An output characteristic of a TFT illustrated in FIG. 12 may be a result value which is obtained through measurement under a condition where Vds=0.1V and Vds=10V. In FIG. 12, Vth[V] and mobility[cm$^2$/Vs] denote result values which are obtained through measurement under a condition where Vds=0.1V, and Vfb[V], S-factor[V/dec], Ion[uA], and Ioff[pA] denote result values which are obtained through measurement under a condition where Vds=10V.

Referring to FIG. 12, the TFT according to the first and second embodiments of the present invention may be applied to the pull-down TFT (T1 of FIG. 1) of the scan circuit, and the TFT according to the third and fourth embodiments of the present invention may be applied to the switching TFT (T2 of FIG. 1) of the scan circuit and the switching TFT (ST1 or ST2 of FIG. 5) of the pixel circuit. In this case, a flatband voltage Vfb and a threshold voltage Vth of a TFT may increase. Also, an on current Ion may increase. Also, a hump is prevented from occurring due to a strong electric field which is generated from an edge of an active layer of a TFT, and thus, a leakage current is reduced. Accordingly, a screen defect of a display apparatus is prevented, and thus, display quality is enhanced.

Figure 13:
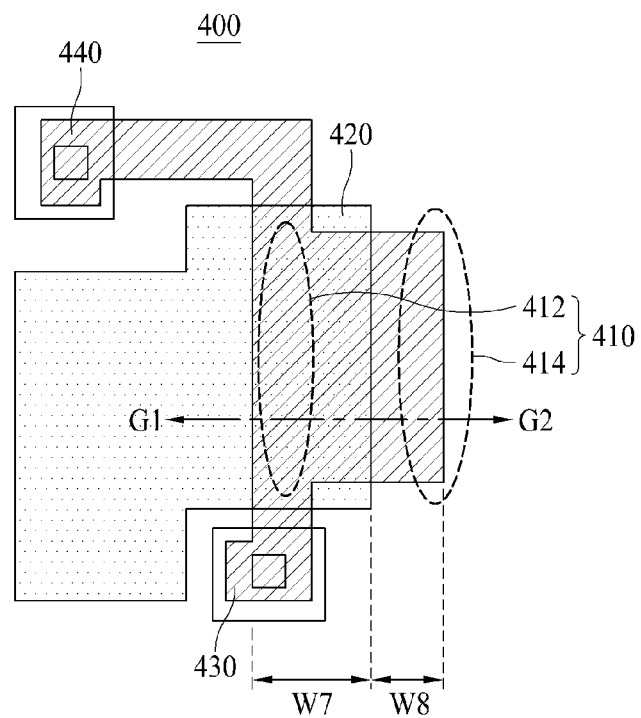
FIG. 13 illustrates a plan layout of a TFT according to a fifth embodiment of the present invention and is a diagram illustrating a plan layout of a driving TFT included in a pixel circuit.
Figure 14:
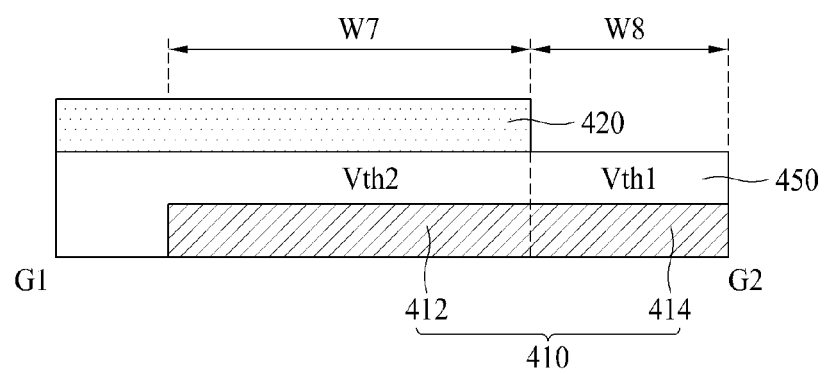
FIG. 14 is a diagram illustrating a cross-sectional surface of a driving TFT taken along line G1-G2 of FIG. 13.

FIG. 13 illustrates a plan layout of a TFT 400 according to a fifth embodiment of the present invention and is a diagram illustrating a plan layout of a driving TFT included in a pixel circuit. FIG. 14 is a diagram illustrating a cross-sectional surface of a driving TFT taken along line G1-G2 of FIG. 13.

Referring to FIGS. 13 and 14, the TFT 400 according to the fifth embodiment of the present invention may be applied to a driving TFT (DT of FIG. 5) of a pixel circuit.

A gate electrode 420 of the TFT 400 may be formed by branching from a gate line. With respect to a plane, a source electrode 430 may be disposed under the gate electrode 420, and a drain electrode 440 may be disposed on the gate electrode 420. However, the present embodiment is not limited thereto. As another example, with respect to the plane, the drain electrode 440 may be disposed under the gate electrode 420, and the source electrode 430 may be disposed on the gate electrode 420. An active layer 410 may be formed to overlap the gate electrode 420.

The TFT 400 according to the fifth embodiment of the present invention may be formed in a top gate structure. The active layer 410 may be formed on a substrate, and a gate insulator 450 may be formed on the active layer 410. The gate electrode 420 may be formed on the gate insulator 450.

The active layer 410 may include a channel area 412 and a dummy area 414 which is disposed at an edge of the channel area 412. Here, the active layer 410 may be formed of low-temperature poly silicon (LTPS), but is not limited thereto. As another example, the active layer 410 may be formed of amorphous silicon (a-Si), poly-Si, oxide, an organic material, or the like.

A portion of the active layer 410 overlapping the gate electrode 420 may be the channel area 412. That is, the channel area 412 may overlap the gate electrode 420. The channel area 412 may be disposed between the source electrode 430 and the drain electrode 440.

The dummy area 414 of the active layer 410 may be disposed to extend from a right edge of the channel area 412 to an outer portion of the gate electrode 420. That is, the dummy area 414 may protrude from one side edge (a right edge) of the channel area 412, and an end of the dummy area 414 may be disposed at one side outer portion (a right outer portion) of the channel area 412. Therefore, the right edge of the active layer 410 may not overlap the gate electrode 420.

However, the present embodiment is not limited thereto. As another example, the dummy area 414 may protrude from a left edge of the channel area 412, and the end of the dummy area 414 may be disposed at a left outer portion of the channel area 412. In this case, the left edge of the active layer 410 may not overlap the gate electrode 420.

Here, the end of the dummy area 414 may be disposed at the left or right edge of the gate electrode 420. Therefore, the end of the dummy area 414 may be disposed at a position which is separated from the left or right edge of the gate electrode 420 by a certain distance.

For example, the dummy area 414 may protrude to an outer portion through an end of the gate electrode 420 by a length W8 corresponding to 50% to 100% of a width W7 of a portion where the gate electrode 420 overlaps active layer 410. That is, the end of the dummy area 414 may be disposed to be separated from an edge of the gate electrode 420 by an interval equal to the length W8 corresponding to 50% to 100% of the width W7 of the portion where the gate electrode 420 overlaps active layer 410.

Here, a length of the dummy area 414 protruding from the channel area 412 is not limited to 50% to 100% of the width W7 of the portion where the gate electrode 420 overlaps active layer 410. It is set by the inventors that the dummy area 414 protrudes to the outer portion of the gate electrode 420 by a length W8 corresponding to a maximum of 100% of the width W7 of the portion where the gate electrode 420 overlaps the active layer 410, in consideration of the design of a driving TFT configuring a pixel circuit and a manufacturing process margin.

The gate insulator 450 may be formed on a right end of the active layer 410. However, the gate electrode 420 may not be disposed on the right end of the active layer 410. Therefore, an edge of the active layer 410 does not overlap the gate electrode 420, and thus, a parasitic TFT caused by an overlap of a gate electrode and an edge of an active layer in the related art cannot be formed in the present invention. For example, even when the parasitic TFT is formed, the parasitic TFT is very small in size.

In the TFT including the above-described elements according to the fifth embodiment of the present invention, a parasitic TFT cannot be formed at one side end of the active layer 410, or the number of parasitic TFTs is minimized. Here, a pattern of the active layer 410 may be changed in order for the edge of the active layer 410 to extend to one side outer portion of the gate electrode 420, and thus, an area where a parasitic TFT is formed is removed or minimized.

The edge of the gate electrode 420 may be disposed in a diagonal direction from one side edge of the active layer 410. However, an interval between the active layer 410 and the gate electrode 420 which are disposed with the gate insulator 450 therebetween is large, and thus, a parasitic TFT is very small in size.

Since one side edge of the active layer 410 do not overlap the gate electrode 420, a threshold voltage Vth1 of a parasitic TFT may have a larger value than that of a threshold voltage Vth2 of the channel area 412 of the active layer 410.

As described above, a parasitic TFT having a small size may be formed at one side edge of the active layer 410, and a threshold voltage Vth1 of the parasitic TFT may have a large value. Therefore, a hump is prevented from occurring in the left edge and right edge of the active layer 410. Also, a strong electric field is not generated in an edge area of the active layer 410.

If the TFT according to the fifth embodiment of the present invention is applied to a driving TFT (DT of FIG. 5) of a pixel circuit, a hump is prevented from occurring due to a parasitic TFT which is formed in the driving TFT of the pixel circuit, and thus, an output characteristic of the driving TFT is enhanced. Also, a leakage current (or an off current) of the driving TFT is reduced, and thus, a screen defect is prevented from occurring due to weak light which is emitted during a turn-off period of an organic light emitting diode OLED, thereby enhancing the display quality of a display apparatus.

Figure 15:
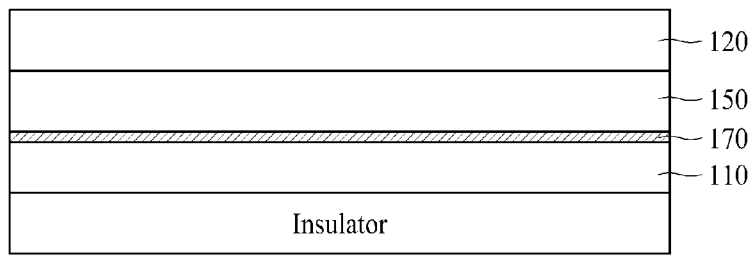
FIG. 15 is a diagram illustrating a pull-down TFT of a scan circuit, a switching TFT (a reset TFT) of the scan circuit, or a switching TFT of a pixel circuit formed in a single gate (top gate) structure, and a channel formed in an active layer.

FIG. 15 is a diagram illustrating a pull-down TFT of a scan circuit, a switching TFT (a reset TFT) of the scan circuit, or a switching TFT of a pixel circuit formed in a single gate (top gate) structure, and a channel formed in an active layer. In FIG. 15, a substrate of a display apparatus is not illustrated.

Referring to FIG. 15, the TFT according to the first to fifth embodiments of the present invention may be formed in a top gate structure where one gate electrode is disposed on an active layer. In detail, an active layer 110 may be disposed on an insulator, and a gate insulator 150 may be disposed on the active layer 110. Also, a gate electrode 120 may be disposed on the gate insulator 150. In this case, the gate electrode 120 may be disposed on the active layer 110 to overlap the active layer 110, and thus, a channel 170 may be formed on a top of the active layer 110.

The pull-down TFT of the scan circuit, the switching TFT of the scan circuit, and the switching TFT of the pixel circuit described above in the first to fourth embodiments of the present invention may be formed in a top gate structure where one gate electrode is disposed on an active layer. In this case, as illustrated in FIG. 12, a flatband voltage Vfb and a threshold voltage Vth of each of the pull-down TFT of the scan circuit, the switching TFT of the scan circuit, and the switching TFT of the pixel circuit may increase. Also, a hump is prevented from occurring due to a strong electric field which is generated from an edge of an active layer of a TFT, and thus, a leakage current is reduced. Accordingly, a screen defect of a display apparatus is prevented, and thus, display quality is enhanced.

Moreover, the driving TFT of the pixel circuit described above in the fifth embodiment of the present invention may be formed in a top gate structure where one gate electrode is disposed on an active layer.

Figure 16:
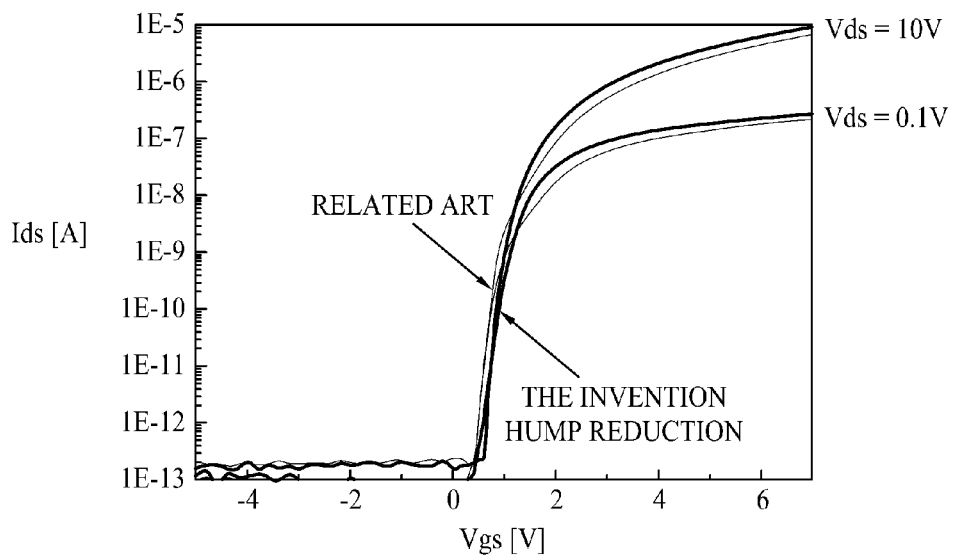
FIG. 16 is a diagram showing effects where, by changing a pattern of an active layer of a driving TFT according to a fifth embodiment of the present invention, an output characteristic of the driving TFT is enhanced, and humps are reduced.

FIG. 16 is a diagram showing effects where, by changing a pattern of an active layer of a driving TFT according to a fifth embodiment of the present invention, an output characteristic of the driving TFT is enhanced, and humps are reduced. An output characteristic of a TFT illustrated in FIG. 16 may be a result value which is obtained through measurement under a condition where Vds=0.1V and Vds=10V. In FIG. 16, Vth[V] and mobility[cm$^2$/Vs] denote result values which are obtained through measurement under a condition where Vds=0.1V, and Vfb[V], S-factor[V/dec], Ion[uA], and Ioff[pA] denote result values which are obtained through measurement under a condition where Vds=10V.

Referring to FIG. 16, if the TFT according to the fifth embodiment of the present invention is applied to a driving TFT (DT of FIG. 5) of a pixel circuit, a flatband voltage Vfb and a threshold voltage Vth of a TFT may increase, and an on current Ion may increase. Therefore, a hump is prevented from occurring due to a strong electric field which is generated from the edge of the active layer 410 of the TFT, and thus, a leakage current is reduced. Accordingly, a screen defect of a display apparatus is prevented, and thus, display quality is enhanced.

Figure 17A:
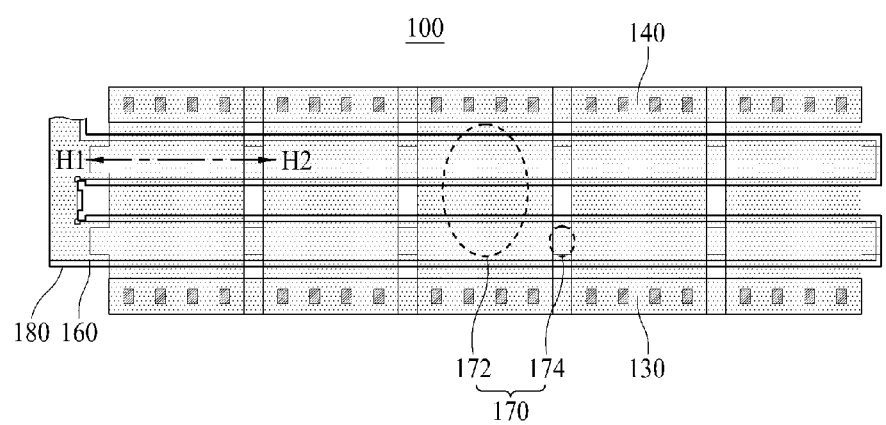
FIG. 17A is a diagram illustrating a pull-down TFT of a scan circuit, a switching TFT (a reset TFT) of the scan circuit, or a driving TFT of a pixel circuit formed in a double gate structure, and a plurality of channels formed in an active layer.

FIG. 17A is a diagram illustrating a pull-down TFT of a scan circuit, a switching TFT (a reset TFT) of the scan circuit, or a driving TFT of a pixel circuit formed in a double gate structure, and a plurality of channels formed in an active layer.

Figure 17B:
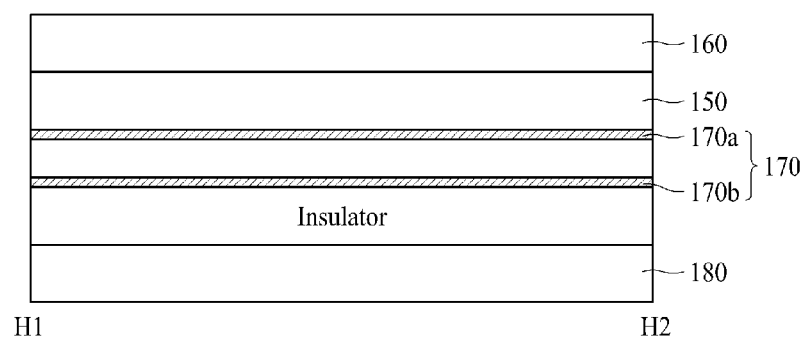
FIG. 17B is a cross-sectional view, taken along line H1-H2 of FIG. 17A, of a pull-down TFT of a scan circuit, a switching TFT (a reset TFT) of the scan circuit, a switching TFT of a pixel circuit, or a driving TFT of the pixel circuit.

FIG. 17B is a cross-sectional view, taken along line H1-H2 of FIG. 17A, of a pull-down TFT of a scan circuit, a switching TFT (a reset TFT) of the scan circuit, a switching TFT of a pixel circuit, or a driving TFT of the pixel circuit.

Referring to FIGS. 17A and 17B, the TFT according to the first to fifth embodiments of the present invention may be formed in a double gate structure where a gate electrode is disposed under an active layer and another gate electrode is disposed on the active layer.

In detail, an active layer 170 may be disposed on an insulator, and a gate insulator 150 may be disposed on the active layer 170. An upper gate electrode 160 (a first gate electrode) may be disposed on the gate insulator 150. Also, a lower gate electrode 180 (a second gate electrode) may be disposed under the insulator. Although not shown in FIG. 17, the upper gate electrode 160 may be electrically connected to the lower gate electrode 180 through a contact.

The upper gate electrode 160 and the lower gate electrode 180 may be formed in the same shape and may be disposed with the active layer 170 therebetween. In this case, an interval between an edge of the upper gate electrode 160 and an end of a dummy area may be the same as an interval between an edge of the lower gate electrode 180 and the end of the dummy area.

However, the present embodiment is not limited thereto. As another example, the upper gate electrode 160 and the lower gate electrode 180 may be formed in different shapes. In this case, the end of the dummy area may be separated from the upper gate electrode 160 by a first interval, and the end of the dummy area may be separated from the lower gate electrode 180 by a second interval. That is, the interval between the edge of the upper gate electrode 160 and the end of the dummy area may differ from the interval between the edge of the lower gate electrode 180 and the end of the dummy area.

When desiring to precisely set an output characteristic of a TFT, the first interval by which the end of the dummy area is separated from the upper gate electrode 160 and the second interval by which the end of the dummy area is separated from the lower gate electrode 180 may be adjusted.

The active layer 170 may include a plurality of channel areas 172 and a plurality of link areas 174 which are disposed between the plurality of channel areas 172.

Here, the active layer 170 may be formed of low-temperature poly silicon (LTPS), but is not limited thereto. As another example, the active layer 170 may be formed of amorphous silicon (a-Si), poly-Si, oxide, an organic material, or the like. The plurality of channel areas 172 may be disposed between the upper gate electrode 160 and the lower gate electrode 180.

The plurality of link areas 174 may be respectively disposed between the plurality of channel areas 172 and may connect the plurality of channel areas 172. That is, the plurality of channel areas 172 may be connected in one pattern by the plurality of link areas 174.

Each of the plurality of link areas 174 may include a slit. The slit may be disposed to overlap a portion corresponding to a space between two lines of the upper gate electrode 160. Also, the slit may be disposed to overlap a portion corresponding to a space between two lines of the lower gate electrode 180.

In a process of forming the active layer 170, the plurality of channel areas 172 and the plurality of link areas 174 may be formed by patterning a conductive transparent material (for example, indium tin oxide (ITO) or the like) layer. Therefore, the plurality of channel areas 172 and the plurality of link areas 174 may be formed of the same material.

The upper gate electrode 160 may be disposed on the active layer 170 to overlap the active layer 170, and thus, a first channel 170*a* may be formed on a top of the active layer 170. Also, the lower gate electrode 180 may be disposed under the active layer 170 to overlap the active layer 170, and thus, a second channel 170*b* formed on a bottom of the active layer 170. That is, if a pull-down TFT of a scan circuit, a switching TFT (a reset TFT) of the scan circuit, a switching TFT of a pixel circuit, and a driving TFT of the pixel circuit are formed in a double gate structure, a channel may be formed on each of the top and bottom of the active layer 170, and thus, the active layer 170 may include a plurality of channels 170*a* and 170*b*.

In comparison with a TFT having a single gate structure, a TFT having the double gate structure is two times the number of channels, namely, two times a width of a channel, and thus, an output characteristic of the TFT is enhanced.

Figure 18:
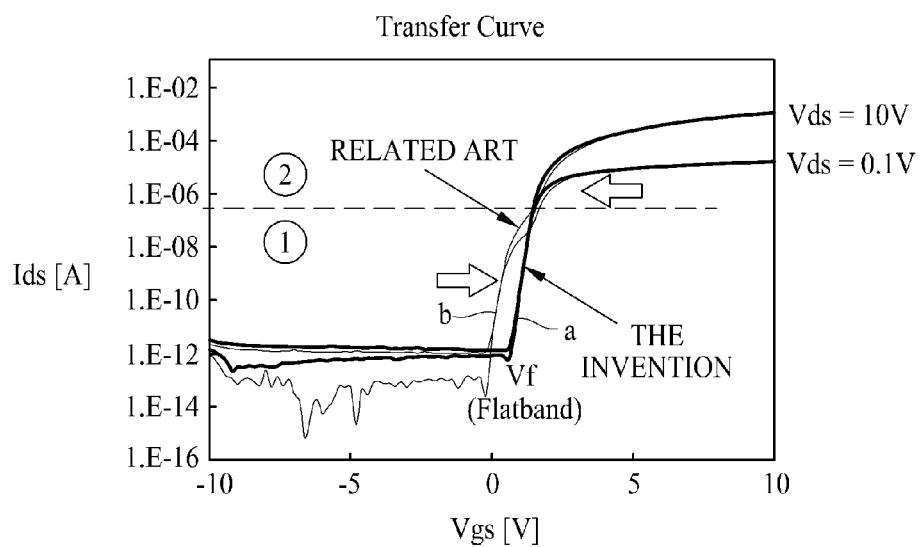
FIG. 18 is a diagram showing effects where, when a pattern of an active layer of a TFT according to embodiments of the present invention is changed and a multi-gate structure is applied, an output characteristic of the TFT is enhanced, and humps are reduced.

FIG. 18 is a diagram showing effects where, when a pattern of an active layer of a TFT according to embodiments of the present invention is changed and a multi-gate structure is applied, an output characteristic of the TFT is enhanced, and humps are reduced. An output characteristic of a TFT illustrated in FIG. 18 may be a result value which is obtained through measurement under a condition where Vds=0.1V and Vds=10V. In FIG. 18, Vth[V] and mobility [$cm^2$/Vs] denote result values which are obtained through measurement under a condition where Vds=0.1V, and Vfb [V], S-factor[V/dec], Ion[uA], and Ioff[pA] denote result values which are obtained through measurement under a condition where Vds=10V.

Referring to FIG. 18, a pull-down TFT of a scan circuit, a switching TFT (a reset TFT) of the scan circuit, a switching TFT of a pixel circuit, and a driving TFT of the pixel circuit may be formed in the double gate structure, thereby preventing a hump from occurring.

In detail, if a TFT is formed in the double gate structure, a flatband voltage Vfb and a threshold voltage Vth of the TFT may increase. Also, an on current Ion may be enhanced.

In FIG. 18, an output characteristic curve of a TFT is shown. The output characteristic curve may consist of a ① region, which shows a low current output characteristic, and a ② region that shows a high current output characteristic. When a hump occurs in the TFT, an output characteristic curve (a) may be shifted (shifted to the left) in a direction of a low voltage in the ① region, and in the ② region, an output characteristic curve (b) may be shifted (shifted to the right) in a direction of a high voltage.

In a pull-down TFT of a scan circuit, a switching TFT (a reset TFT) of the scan circuit, a switching TFT of a pixel circuit, and a driving TFT of the pixel circuit, a pattern of an active layer may be changed, and the double gate structure may be applied. Accordingly, a hump cannot occur in the TFTs.

As shown in FIGS. 6, 7, 9, 10 and 13, it is confirmed that, by changing the pattern of the active layer, the output characteristic curve (a) which has been shifted (shifted to the left) in the direction of the low voltage in the ① region is shifted (shifted to the right) to a position of a normal voltage.

Moreover, as shown in FIGS. 6, 7, 9, 10 and 13, it is confirmed that, by changing the pattern of the active layer and forming a TFT in the double gate structure as shown in FIG. 17, the output characteristic curve (b) which has been shifted (shifted to the right) in the direction of the high voltage in the ② region is shifted (shifted to the left) to the position of the normal voltage.

Therefore, the pull-down TFT of the scan circuit, the switching TFT (the reset TFT) of the scan circuit, the switching TFT of the pixel circuit, and the driving TFT of the pixel circuit normally output signals, thereby enhancing the display quality of a display apparatus.

Figure 19:
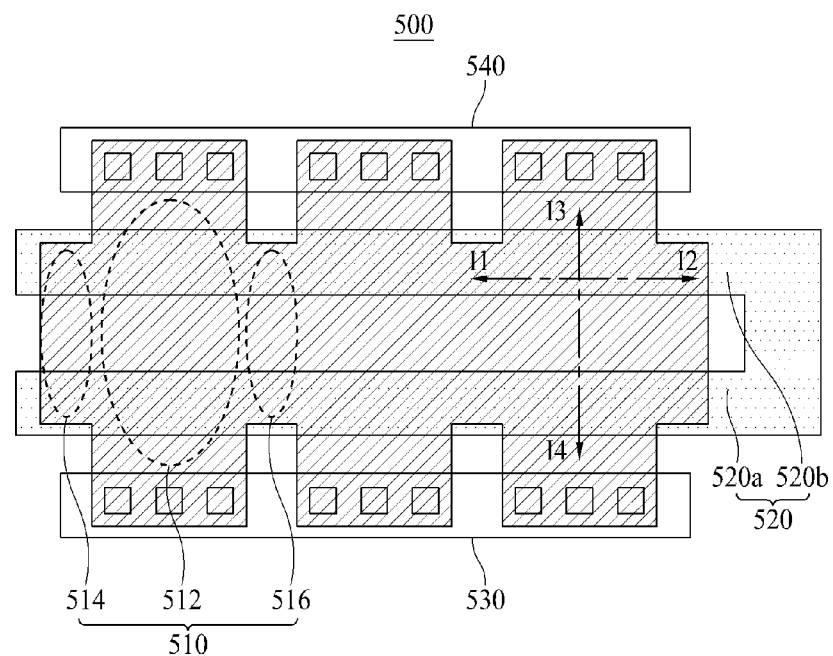
FIG. 19 illustrates a plan layout of a TFT according to a sixth embodiment of the present invention and is a diagram illustrating a plan layout of a pull-down TFT among a plurality of buffer TFTs included in a scan circuit of a gate driver.
Figure 20A:
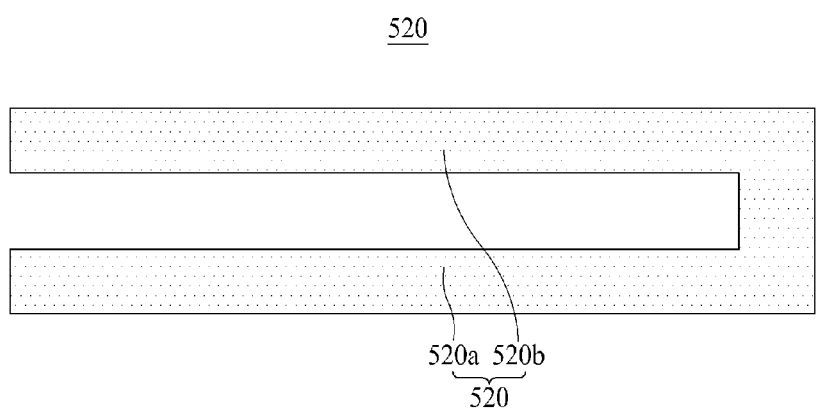
FIG. 20A is a diagram illustrating a gate electrode in a plan layout of a pull-down TFT illustrated in FIG. 19.
Figure 20B:
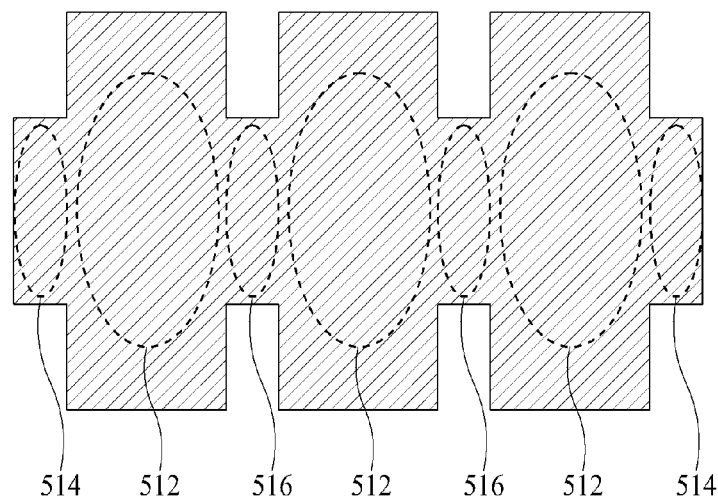
FIG. 20B is a diagram illustrating an active layer in the plan layout of the pull-down TFT illustrated in FIG. 19.
Figure 20C:
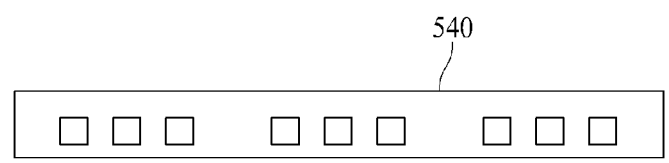
FIG. 20C is a diagram illustrating a source electrode and a drain electrode in the plan layout of the pull-down TFT illustrated in FIG. 19.
Figure 20C:
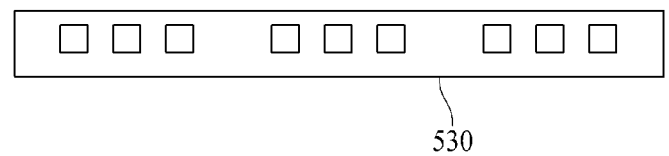
Figure 21A:
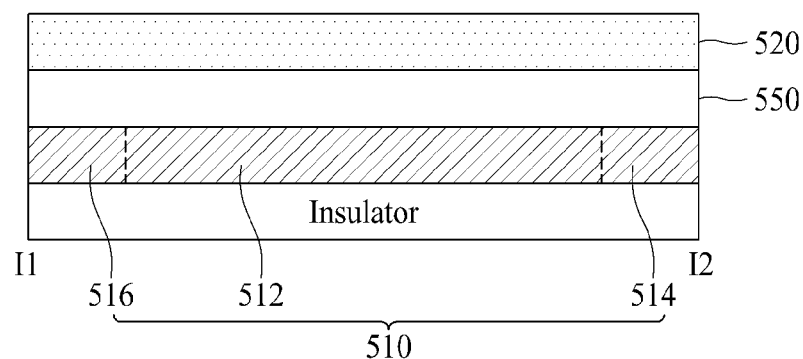
FIG. 21A is a diagram illustrating a cross-sectional surface taken along line 11-12 of FIG. 19.
Figure 21B:
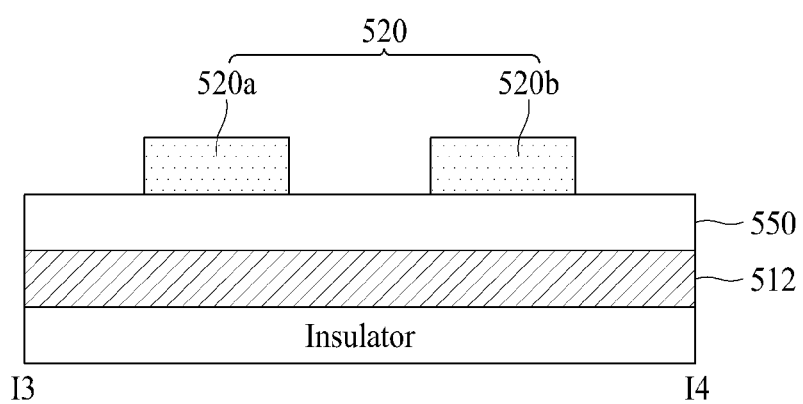
FIG. 21B is a diagram illustrating a cross-sectional surface taken along line 13-14 of FIG. 19.

FIG. 19 illustrates a plan layout of a TFT 500 according to a sixth embodiment of the present invention and is a diagram illustrating a plan layout of a pull-down TFT among a plurality of buffer TFTs included in a scan circuit of a gate driver. FIG. 20A is a diagram illustrating a gate electrode in a plan layout of a pull-down TFT illustrated in FIG. 19. FIG. 20B is a diagram illustrating an active layer in the plan layout of the pull-down TFT illustrated in FIG. 19. FIG. 20C is a diagram illustrating a source electrode and a drain electrode in the plan layout of the pull-down TFT illustrated in FIG. 19. FIG. 21A is a diagram illustrating a cross-sectional surface taken along line 11-12 of FIG. 19. FIG. 21B is a diagram illustrating a cross-sectional surface taken along line 13-14 of FIG. 19.

Referring to FIGS. 19 to 21B, the TFT 500 according to the sixth embodiment of the present invention may be applied to a plurality of buffer TFTs (a pull-up TFT and a pull-down TFT) of a scan circuit. Hereinafter, an example where the TFT 500 according to the sixth embodiment of the present invention is applied to a pull-down TFT (T1 of FIG. 1) among the buffer TFTs of the scan circuit will be described.

The pull-down TFT of the scan circuit may be implemented to have a larger area than those of general switching TFTs so as not to be deteriorated by a high voltage and long-time driving. In the TFT 500 according to the sixth embodiment of the present invention, a gate electrode 520 may be formed in a double line structure for forming a multichannel.

A first line 520*a* and a second line 520*b* of the gate electrode 520 may be electrically connected to each other. An active layer 510 may be disposed to overlap the first line 520*a* and second line 520*b* of the gate electrode 520, thereby forming the multichannel.

The TFT 500 according to the sixth embodiment of the present invention may be formed in a top gate structure. The active layer 510 may be formed on an insulator, and a gate insulator 550 may be formed on the active layer 510. The gate electrode 520 may be formed on the gate insulator 550.

The gate electrode 520 may branch as two the lines 520*a* and 520*b* from a gate line and may be long formed in a horizontal direction. With respect to a plane, a source electrode 530 may be disposed under the gate electrode 520, and a drain electrode 540 may be disposed on the gate electrode 520. However, the present embodiment is not limited thereto. As another example, with respect to the plane, the drain electrode 540 may be disposed under the gate electrode 520, and the source electrode 530 may be disposed on the gate electrode 520.

The active layer 510 may be formed to overlap the gate electrode 520, and a channel area 512 of the active layer 510 may contact the source electrode 530 and the drain electrode 540. The gate electrode 520 may not wholly overlap the active layer 510, and the gate electrode 520 may partially overlap the active layer 510.

Here, the source electrode 530 and the drain electrode 540 may be respectively disposed at both ends of the active layer 510. The source electrode 530 may be connected to a data line through a contact metal which is provided in a contact hole, and the drain electrode 540 may be connected to an anode electrode (or a signal line) of an organic light emitting diode (OLED).

The active layer 510 may include a plurality of channel areas 512, a dummy area 514 which is disposed at each of a left edge and a right edge of each of a plurality of the channel areas 512, and a plurality of link areas 516 which are disposed between the plurality of channel areas 512.

Here, the active layer 510 may be formed of low-temperature poly silicon (LTPS), but is not limited thereto. As another example, the active layer 510 may be formed of amorphous silicon (a-Si), poly-Si, oxide, an organic material, or the like.

The plurality of channel areas 512 may overlap the gate electrode 520 for forming a multichannel and may be disposed between the source electrode 530 and the drain electrode 540.

The plurality of link areas 516 may be respectively disposed between the plurality of channel areas 512 and may connect the plurality of channel areas 512. That is, the plurality of channel areas 512 may be connected in one pattern by the plurality of link areas 516. In a process of forming the active layer 510, the plurality of channel areas 512 and the plurality of link areas 516 may be formed by patterning a conductive transparent material (for example, indium tin oxide (ITO) or the like) layer. Therefore, the plurality of channel areas 512 and the plurality of link areas 516 may be formed of the same material.

Here, a vertical width of each of the plurality of link areas 516 may be formed greater than a vertical-direction width of each of the two lines 520a and 520b of the gate electrode 520. As another example, a width of each of the plurality of link areas 516 may be formed less than that of the gate electrode 520, but the vertical width of each of the plurality of link areas 516 may be greater than the sum of vertical widths of the first and second lines 520a and 520b of the gate electrode 520.

In the first and second embodiments illustrated in FIGS. 6 and 7, a link area is not formed at a portion corresponding to an empty space between two lines of a gate electrode. On the other hand, in the sixth embodiment illustrated in FIG. 19, the link area 516 is formed at a portion corresponding to an empty space between the two lines 520a and 520b of the gate electrode 520.

If a display apparatus has a resolution of quad high definition (QHD) or more (for example, a 4K resolution or an 8K resolution), channel lengths of a TFT of a pixel circuit and a buffer TFT of a scan circuit are reduced. For example, when the vertical width of each of the two lines 520a and 520b of the gate electrode 520 is equal to or less than 3 μm, as illustrated in FIG. 17, the link area 516 may be formed at the portion corresponding to the empty space between the two lines 520a and 520b of the gate electrode 520. Therefore, the channel area 512, the dummy area 514, and the link area 516 for preventing or reducing humps may be applied to high-resolution display apparatuses.

Particularly, when the vertical width of each of the two lines 520a and 520b of the gate electrode 520 is equal to or less than 1 μm, as illustrated in FIG. 19, the link area 516 may be formed at the portion corresponding to the empty space between the two lines 520a and 520b of the gate electrode 520 and thus may connect the plurality of channel areas 512. Therefore, the channel area 512, the dummy area 514, and the link area 516 for preventing or reducing humps may be applied to display apparatuses having a high resolution (QHD, 4K or 8K).

The dummy area 514 may be disposed at each of a left edge and a right edge of the channel area 512. That is, the dummy area 514 may protrude from each of the left edge and right edge of the channel area 512. For example, the dummy area 514 may protrude by a length corresponding to 10% to 30% of a horizontal width of one the channel area 512.

Here, a length of the dummy area 514 protruding from the channel area 512 is not limited to 10% to 30% of a horizontal width of one the channel area 512. It is set by the inventors that the dummy area 514 protrudes by a length corresponding to a maximum of 30% of a horizontal width of one the channel area 512 in consideration of the design of a pull-down TFT configuring a scan circuit and a manufacturing process margin.

As another example, the dummy area 514 may protrude by a length corresponding to 10% to 30% of a width of the gate electrode 520. Here, the length of the dummy area 514 protruding from the channel area 512 is not limited to 10% to 30% of the width of the gate electrode 520. It is set by the inventors that the dummy area 514 protrudes by a length corresponding to a maximum of 30% of the width of the gate electrode 520 in consideration of the design of the pull-down TFT configuring the scan circuit and the manufacturing process margin.

As another example, the dummy area 514 may protrude by a length corresponding to 10% to 30% of a width of a portion where the gate electrode 520 overlaps the active layer 510. Here, the length of the dummy area 514 protruding from the channel area 512 is not limited to 10% to 30% of the width of the portion where the gate electrode 520 overlaps the active layer 510. It is set by the inventors that the dummy area 514 protrudes by a length corresponding to a maximum of 30% of the width of the portion where the gate electrode 520 overlaps the active layer 510, in consideration of the design of the pull-down TFT configuring the scan circuit and the manufacturing process margin.

As another example, in a driving TFT of a pixel circuit instead of a switching TFT and the pull-down TFT configuring the scan circuit, the dummy area 514 may protrude by a length corresponding to 50% to 100% of the width of the portion where the gate electrode 520 overlaps the active layer 510.

Here, the length of the dummy area 514 protruding from the channel area 512 is not limited to 50% to 100% of the width of the portion where the gate electrode 520 overlaps the active layer 510. It is set by the inventors that the dummy area 514 protrudes by a length corresponding to a maximum of 100% of the width of the portion where the gate electrode 520 overlaps the active layer 510, in consideration of the design of the driving TFT configuring the pixel circuit and the manufacturing process margin.

In the TFT 500 including the above-described elements according to the sixth embodiment of the present invention, a parasitic TFT cannot be formed at a left end and a right end of the active layer 510, or the number of parasitic TFTs is minimized. Despite a parasitic TFT being formed, since the parasitic TFT is disposed in the dummy area 514, a hump is prevented from occurring due to a parasitic TFT which is formed in a buffer TFT of the scan circuit, thereby enhancing an output characteristic of the buffer TFT of the scan circuit.

If the output characteristic of the buffer TFT of the scan circuit is enhanced, a screen defect of a display apparatus is prevented, and thus, display quality is enhanced.

If the TFT 500 according to the sixth embodiment of the present invention is applied to the buffer TFTs (in detail, the pull-down TFT) of the scan circuit of the gate driver, a leakage current (or an off current) is prevented from occurring in the scan circuit or is reduced. Accordingly, a signal is normally output through the Q node and QB node of the scan circuit, and thus, a screen defect of a display apparatus is prevented.

Figure 22:
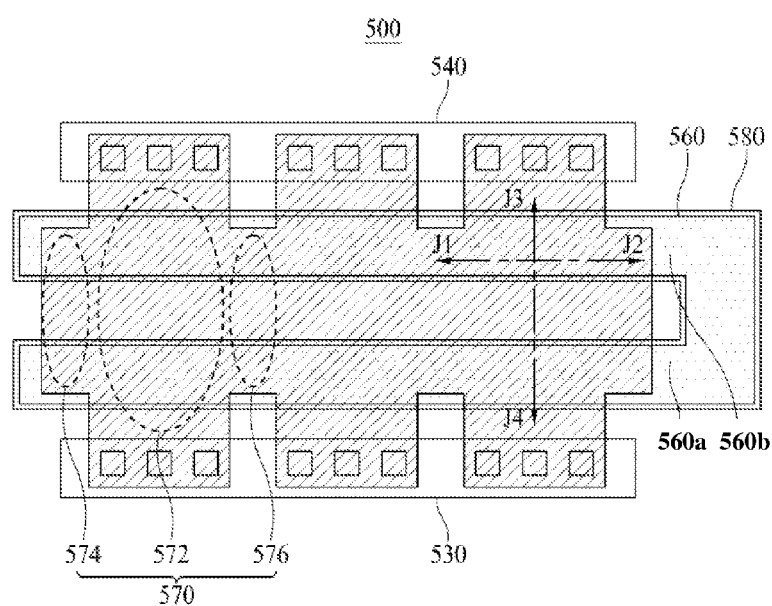
FIG. 22 illustrates a plan layout of a TFT according to a seventh embodiment of the present invention and is a plan view illustrating a pull-down TFT of a scan circuit formed in a double gate structure and a plurality of channels formed in an active layer.
Figure 23A:
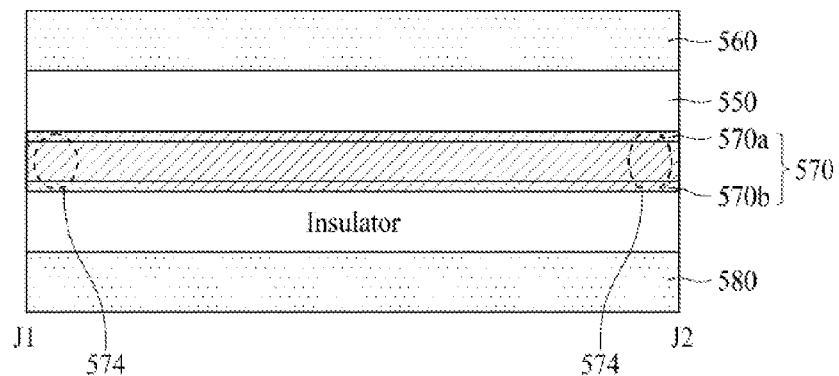
FIG. 23A is a cross-sectional view of a pull-down TFT of a scan circuit taken along line J1-J2 of FIG. 22.
Figure 23B:
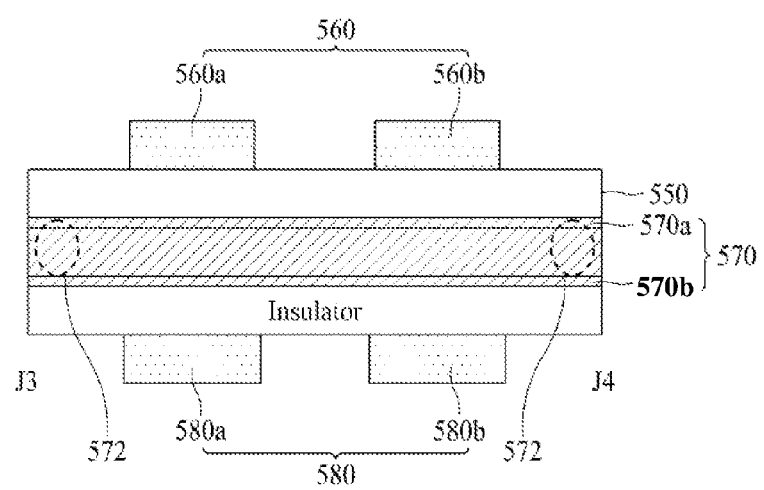
FIG. 23B is a cross-sectional view of the pull-down TFT of the scan circuit taken along line J3-J4 of FIG. 22.

FIG. 22 illustrates a plan layout of a TFT according to a seventh embodiment of the present invention and is a plan view illustrating a pull-down TFT of a scan circuit formed in a double gate structure and a plurality of channels formed in an active layer. FIG. 23A is a cross-sectional view of a pull-down TFT of a scan circuit taken along line J1-J2 of FIG. 22. FIG. 23B is a cross-sectional view of the pull-down TFT of the scan circuit taken along line J3-J4 of FIG. 22.

Referring to FIGS. 22 to 23B, a pull-down TFT 500 may be formed in a double gate structure where an upper gate electrode 560 is disposed on an active layer 570 and a lower gate electrode 580 is disposed under the active layer 570. Here, the pull-down TFT 500 of the scan circuit may be implemented to have a larger area than those of general switching TFTs so as not to be deteriorated by a high voltage and long-time driving.

In detail, the active layer 570 may be disposed on an insulator, and a gate insulator 550 may be disposed on the active layer 570. The upper gate electrode 560 (a first gate electrode) may be disposed on the gate insulator 550. Also, the lower gate electrode 580 (a second gate electrode) may be disposed under the insulator. Although not shown in the drawing, the upper gate electrode 560 may be electrically connected to the lower gate electrode 580 through a contact.

Two lines 560a and 560b of the upper gate electrode 560 may be electrically connected to each other. A first line 560a and a second line 560b of the upper gate electrode 560 may be electrically connected to each other, and an active layer 570 may be disposed in order for the first line 560a and second line 560b of the upper gate electrode 560 to overlap each other, thereby forming a multichannel.

Moreover, two lines 580a and 580b of the lower gate electrode 580 may be electrically connected to each other. A first line 580a and a second line 580b of the lower gate electrode 580 may be electrically connected to each other, and the active layer 570 may be disposed in order for the first line 580a and second line 580b of the lower gate electrode 580 to overlap each other, thereby forming a multichannel.

The upper gate electrode 560 and the lower gate electrode 580 may be formed in the same shape and may be disposed with the active layer 570 therebetween. In this case, an interval between an edge of the upper gate electrode 560 and an end of a dummy area 574 may be the same as an interval between an edge of the lower gate electrode 580 and the end of the dummy area 574.

However, the present embodiment is not limited thereto. As another example, the upper gate electrode 560 and the lower gate electrode 580 may be formed in different shapes. In this case, the end of the dummy area 574 may be separated from an end of the upper gate electrode 560 by a first interval, and the end of the dummy area 574 may be separated from an end of the lower gate electrode 580 by a second interval. That is, the interval between the edge of the upper gate electrode 560 and the end of the dummy area 574 may differ from the interval between the edge of the lower gate electrode 580 and the end of the dummy area 574.

The active layer 570 may include a plurality of channel areas 572 and a plurality of link areas 576 which are disposed between the plurality of channel areas 572.

Here, the active layer 570 may be formed of low-temperature poly silicon (LTPS), but is not limited thereto. As another example, the active layer 570 may be formed of amorphous silicon (a-Si), poly-Si, oxide, an organic material, or the like. The plurality of channel areas 572 may be disposed between the upper gate electrode 560 and the lower gate electrode 580.

The plurality of link areas 576 may be respectively disposed between the plurality of channel areas 572 and may connect a plurality of channel areas 572. That is, the plurality of channel areas 572 may be connected in one pattern by the plurality of link areas 576. In a process of forming the active layer 570, the plurality of channel areas 572, the plurality of dummy areas 574, and the plurality of link areas 576 may be formed by patterning a conductive transparent material (for example, indium tin oxide (ITO) or the like) layer. Therefore, the plurality of channel areas 572, the plurality of dummy areas 574, and the plurality of link areas 576 may be formed of the same material.

The upper gate electrode 560 may be disposed on the active layer 570 to overlap the active layer 570, and thus, a first channel 570a may be formed on a top of the active layer 570. Also, the lower gate electrode 580 may be disposed under the active layer 570 to overlap the active layer 570, and thus, a second channel 570b may be formed on a bottom of the active layer 570. That is, if a pull-down TFT of a scan circuit is formed in a double gate structure, a channel may be formed on each of the top and bottom of the active layer 570, and thus, the active layer 570 may include a plurality of channels 570a and 570b.

However, the present embodiment is not limited thereto. As another example, the double gate structure may be applied to a switching TFT (a reset TFT) of the scan circuit, a switching TFT of a pixel circuit, and a driving TFT of the pixel circuit. Therefore, even in the switching TFT (the reset TFT) of the scan circuit, the switching TFT of the pixel circuit, and the driving TFT of the pixel circuit, a channel may be formed on each of a top and a bottom of an active layer.

In comparison with a TFT having a single gate structure, a TFT having the double gate structure is two times the number of channels, namely, two times a width of a channel, and thus, an output characteristic of the TFT is enhanced.

Figure 24:
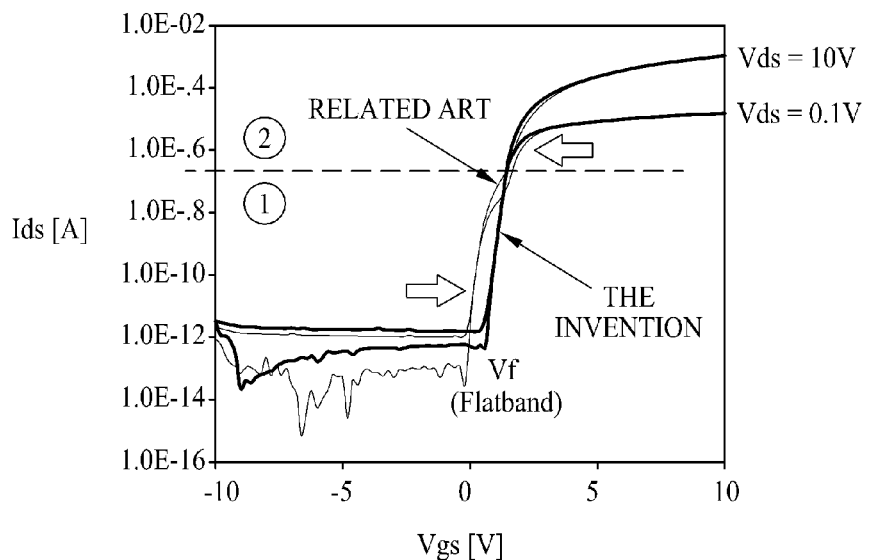
FIG. 24 is a diagram showing effects where, by changing a pattern of an active layer of a pull-down TFT according to a seventh embodiment of the present invention, an output characteristic of the pull-down TFT is enhanced, and humps are reduced.

FIG. 24 is a diagram showing effects where, by changing a pattern of an active layer of a pull-down TFT according to a seventh embodiment of the present invention, an output characteristic of the pull-down TFT is enhanced, and humps are reduced. An output characteristic of a TFT illustrated in FIG. 24 may be a result value which is obtained through measurement under a condition where Vds=0.1V and Vds=10V. In FIG. 24, Vth[V] and mobility[$cm^2$/Vs] denote result values which are obtained through measurement under a condition where Vds=0.1V, and Vfb[V], S-factor[V/dec], Ion[uA], and Ioff[pA] denote result values which are obtained through measurement under a condition where Vds=10V.

Referring to FIG. 24, a hump is prevented from occurring in a pull-down TFT of a scan circuit. In detail, a flatband voltage Vfb and a threshold voltage Vth of a TFT may increase. Also, an on current Ion may be enhanced.

In FIG. 24, an output characteristic curve of a TFT is shown. The output characteristic curve may consist of a ① region, which shows a low current output characteristic, and a ② region that shows a high current output characteristic.

When a hump occurs in the TFT, an output characteristic curve (a) may be shifted (shifted to the left) in a direction of a low voltage in the ① region, and in the ② region, an output characteristic curve (b) may be shifted (shifted to the right) in a direction of a high voltage.

In the pull-down TFT of the scan circuit, a switching TFT (a reset TFT) of the scan circuit, a switching TFT of a pixel circuit, and a driving TFT of the pixel circuit, by changing a pattern of an active layer, a hump cannot occur in the TFTs.

It is confirmed that the output characteristic curve (a) which has been shifted (shifted to the left) in the direction of the low voltage in the ① region is shifted (shifted to the right) to a position of a normal voltage. Also, it is confirmed that the output characteristic curve (b) which has been shifted (shifted to the right) in the direction of the high voltage in the ② region is shifted (shifted to the left) to the position of the normal voltage. Therefore, the pull-down TFT of the scan circuit normally outputs a signal, thereby enhancing the display quality of a display apparatus.

In the above-described TFT of the display apparatus according to the embodiments of the present invention, a vertical width of each of the plurality of link areas may be less than that of each of the plurality of lines.

Moreover, the vertical width of each of the plurality of link areas may be greater than that of each of the plurality of lines.

Moreover, the vertical width of each of the plurality of link areas may be greater than the sum of vertical widths of the plurality of lines.

Moreover, each of the plurality of link areas may include a slit, and the slit may be disposed to overlap a portion corresponding to a space between the plurality of lines.

Moreover, the plurality of link areas may be disposed to overlap a portion corresponding to the space between the plurality of lines.

Moreover, the dummy area may protrude from one edge or both edges of the channel area and may be disposed at an outer portion of the first gate electrode.

Moreover, the dummy area may protrude to the outer portion of the first gate electrode by a length corresponding to a maximum of 30% of a width of the first gate electrode.

Moreover, the dummy area may protrude to the outer portion of the first gate electrode by a length corresponding to a maximum of 30% of a width of a portion where the first gate electrode overlaps the active layer.

Moreover, the dummy area may protrude to the outer portion of the first gate electrode by a length corresponding to a maximum of 100% of the width of the portion where the first gate electrode overlaps the active layer.

Moreover, the dummy area may protrude from one edge or both edges of the channel area and protrude by a length corresponding to a maximum of 30% of a horizontal width of one channel area.

Moreover, a first threshold voltage of the dummy area may be higher than a second threshold voltage of the channel area.

The above-described TFT of the display apparatus according to the embodiments of the present invention may include: an insulator disposed under an active layer; and a second gate electrode disposed under the insulator, the second gate electrode branching as a plurality of lines. The second gate electrode may be disposed to overlap the active layer, and the first gate electrode may be electrically connected to the second gate electrode.

Moreover, the active layer may overlap a plurality of lines of the first gate electrode to thereby form a multichannel on a top of the active layer.

Moreover, the active layer may overlap the plurality of lines of the second gate electrode to thereby form a multichannel on a bottom of the active layer.

Moreover, an end of each of the plurality of channel areas may not overlap the first gate electrode.

Moreover, the end of each of the plurality of channel areas may not overlap the second gate electrode.

As described above, according to the embodiments of the present invention, the TFT prevents a hump from occurring, thereby reducing a leakage current.

Moreover, according to the embodiments of the present invention, the occurrence of a hump is prevented by changing the active layer pattern of the TFT included in the scan circuit of the gate driver, and thus, the output voltage Vgout of the scan circuit is prevented from being dropped, thereby preventing a screen defect of the display apparatus.

Moreover, according to the embodiments of the present invention, by changing the active layer pattern of the driving TFT included in the pixel circuit, a leakage current (or an off current) is prevented from occurring due to a hump, thereby preventing a screen defect of the display apparatus.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor (TFT) of a display apparatus, the TFT comprising:
    an active layer on a substrate;
    a plurality of lines of a first gate electrode overlapping the active layer, the first gate electrode branching as a plurality of lines;
    a gate insulator between the active layer and the first gate electrode; and
    a source electrode and a drain electrode respectively at two ends of the active layer,
    wherein the active layer comprises:
        one or more channel areas between the source electrode and the drain electrode;
        one or more dummy areas, a length of each of the one or more dummy areas extending from an edge of a corresponding channel area perpendicular to an operating current in the one or more channel areas; and
        a plurality of link areas between the one or more channel areas to connect the one or more channel areas in one contiguous area,
        wherein the one or more channel areas and the plurality of link areas are of a same layer.

2. The TFT of claim 1, wherein a vertical width of each of the plurality of link areas is less than a vertical width of each of the plurality of lines of the first gate electrode.

3. The TFT of claim 1, wherein a vertical width of each of the plurality of link areas is greater than a vertical width of each of the plurality of lines of the first gate electrode.

4. The TFT of claim 1, wherein a vertical width of each of the plurality of link areas is greater than a sum of vertical widths of the plurality of lines of the first gate electrode.

5. The TFT of claim 1, wherein each of the plurality of link areas comprises a slit, and
    wherein the slit overlaps a portion corresponding to a space between the plurality of lines of the first gate electrode.

6. The TFT of claim 1, wherein the plurality of link areas overlaps a portion corresponding to a space between the plurality of lines of the first gate electrode.

7. The TFT of claim 1, wherein each of the one or more dummy areas protrudes from the edge of a corresponding channel area and is at an outer portion of the first gate electrode.

8. The TFT of claim 7, wherein each of the one or more dummy areas protrudes to the outer portion of the first gate electrode by a length corresponding to a maximum of 30% of a width of the first gate electrode.

9. The TFT of claim 7, wherein each of the one or more dummy areas protrudes to the outer portion of the first gate electrode by a length corresponding to a maximum of 30% of a width of a portion where the first gate electrode overlaps the active layer.

10. The TFT of claim 7, wherein each of the one or more dummy areas protrudes to the outer portion of the first gate electrode by a length corresponding to a maximum of 100% of a width of a portion where the first gate electrode overlaps the active layer.

11. The TFT of claim 7, wherein each of the one or more dummy areas protrudes from the edge or the both edges of the corresponding channel area by a length corresponding to a maximum of 30% of a horizontal width of one channel area.

12. The TFT of claim 7, wherein an end of each of the one or more channel areas does not overlap the first gate electrode.

13. The TFT of claim 1, wherein a first threshold voltage of each of the one or more dummy areas is higher than a second threshold voltage of each of the one or more channel areas.

14. The TFT of claim 5, further comprising:
an insulator under the active layer; and
a second gate electrode under the insulator, the second gate electrode branching as a plurality of lines of the first gate electrode,
wherein the second gate electrode overlaps the active layer, and the first gate electrode is electrically connected to the second gate electrode.

15. The TFT of claim 14, wherein the active layer overlaps the plurality of lines of the first gate electrode to form a multichannel on a top of the active layer.

16. The TFT of claim 14, wherein the active layer overlaps the plurality of lines of the second gate electrode to form a multichannel on a bottom of the active layer.

17. The TFT of claim 7, wherein an end of each of the one or more channel areas does not overlap the second gate electrode.

18. The TFT of claim 6, further comprising:
an insulator under the active layer; and
a second gate electrode under the insulator, the second gate electrode branching as a plurality of lines of the first gate electrode,
wherein the second gate electrode overlaps the active layer, and the first gate electrode is electrically connected to the second gate electrode.

19. The TFT of claim 18, wherein the active layer overlaps the plurality of lines of the first gate electrode to form a multichannel on a top of the active layer.

20. The TFT of claim 18, wherein the active layer overlaps the plurality of lines of the second gate electrode to form a multichannel on a bottom of the active layer.

* * * * *